(12) United States Patent
Bang et al.

(10) Patent No.: US 12,108,642 B2
(45) Date of Patent: Oct. 1, 2024

(54) DISPLAY SUBSTRATE INCLUDING THIRD GATE LINE BETWEEN FIRST GATE ELECTRODE AND SECOND ACTIVE PATTERN

(71) Applicant: Samsung Display Co., Ltd., Yongin-si (KR)

(72) Inventors: Kiho Bang, Yongin-si (KR); Inhyuck Yeo, Yongin-si (KR); Jiseon Lee, Yongin-si (KR); Pilsuk Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 417 days.

(21) Appl. No.: 17/504,225

(22) Filed: Oct. 18, 2021

(65) Prior Publication Data

US 2022/0149140 A1    May 12, 2022

(30) Foreign Application Priority Data

Nov. 6, 2020    (KR) .................. 10-2020-0148131

(51) Int. Cl.
  *H01L 29/08*     (2006.01)
  *H10K 59/121*    (2023.01)
  *H10K 59/131*    (2023.01)

(52) U.S. Cl.
  CPC ....... *H10K 59/131* (2023.02); *H10K 59/1213* (2023.02)

(58) Field of Classification Search
  CPC .................... H10K 59/131; H10K 59/1213
  USPC ........................................................ 257/40
  See application file for complete search history.

(56) References Cited

U.S. PATENT DOCUMENTS

| | | | |
|---|---|---|---|
| 8,378,352 B2 | 2/2013 | Lee et al. | |
| 10,038,044 B2 | 7/2018 | Shin | |
| 2019/0006390 A1 | 1/2019 | Park | |
| 2019/0181255 A1* | 6/2019 | Nagata | H01L 29/66348 |
| 2019/0355799 A1* | 11/2019 | Jeong | H10K 59/124 |
| 2020/0212152 A1 | 7/2020 | Chun | |
| 2021/0013287 A1 | 1/2021 | Bang et al. | |

FOREIGN PATENT DOCUMENTS

| | | | | |
|---|---|---|---|---|
| DE | 112019006894 T5 * | 11/2021 | ......... | H01L 21/0465 |
| KR | 10-1372852 B1 | 3/2014 | | |
| KR | 10-2017-0000029 A | 1/2017 | | |
| KR | 10-2017-0123387 A | 11/2017 | | |
| KR | 10-2019-0003017 A | 1/2019 | | |
| KR | 10-2020-0083700 A | 7/2020 | | |
| KR | 20220002795 A * | 1/2022 | ........... | H10K 59/131 |

\* cited by examiner

*Primary Examiner* — Phuc T Dang
(74) *Attorney, Agent, or Firm* — Lewis Roca Rothgerber Christie LLP

(57) ABSTRACT

A display device includes: a first active pattern above a substrate; a first gate electrode above the first active pattern; a second active pattern above the first gate electrode; a second gate electrode above the second active pattern; and a first gate line between the first gate electrode and the second active pattern and extending in a first direction, wherein the second gate electrode is electrically connected to the first gate line through a contact portion penetrating an insulating layer between the second gate electrode and the first gate line, wherein, in a plan view, a width of the second gate electrode surrounding the contact portion is 1.5 micrometers (μm) or greater.

20 Claims, 20 Drawing Sheets

DISPLAY SUBSTRATE INCLUDING THIRD GATE LINE BETWEEN FIRST GATE ELECTRODE AND SECOND ACTIVE PATTERN

CROSS-REFERENCE TO RELATED APPLICATION

The present application claims priority to and the benefit of Korean Patent Application No. 10-2020-0148131, filed on Nov. 6, 2020, in the Korean Intellectual Property Office, the entire disclosure of which is incorporated herein by reference.

BACKGROUND

1. Field

Aspects of one or more embodiments relate to a display device.

2. Description of Related Art

As the field of displays for visually representing various types of electrical signal information rapidly develops, various display devices having excellent characteristics such as thinness, light weight, and low power consumption have been introduced. From among display devices, an organic light-emitting display device has advantages, such as a wide viewing angle, a high contrast ratio, and a rapid response speed, and thus has been gaining attention as a next-generation display device.

Such a display device includes a thin-film transistor (TFT) and a capacitor as a driving circuit. In this regard, the TFT may include an active layer including a channel region, a source region, and a drain region, and a gate electrode electrically insulated from the active layer by a gate insulating layer. Generally, the active layer of the TFT may include amorphous silicon or polysilicon.

The above information disclosed in this Background section is only for enhancement of understanding of the background and therefore the information discussed in this Background section does not necessarily constitute prior art.

SUMMARY

Aspects of one or more embodiments relate to a display device, and for example, to a display device in which characteristics of a circuit including a thin-film transistor have improved.

When the active layer of the thin-film transistor (TFT) includes amorphous silicon, charge mobility is low, and thus, it may be relatively difficult to implement a driving circuit that operates at a high speed. When the active layer of the TFT includes polysilicon, charge mobility may be improved; however, a threshold voltage (Vth) of the TFT is non-uniform, and thus, a separate compensation circuit has to be added.

Aspects of one or more embodiments include a display device in which characteristics of a circuit including a thin-film transistor have improved. However, such a technical problem is an example, and embodiments according to the present disclosure are not limited thereto.

Additional aspects will be set forth in part in the description which follows and, in part, will be apparent from the description, or may be learned by practice of the presented embodiments of the disclosure.

According to one or more embodiments, a display device includes a first active pattern arranged above a substrate, a first gate electrode arranged above the first active pattern, a second active pattern arranged above the first gate electrode, a second gate electrode arranged above the second active pattern, and a first gate line between the first gate electrode and the second active pattern and extending in a first direction, wherein the second gate electrode is electrically connected to the first gate line through a contact portion penetrating an insulating layer between the second gate electrode and the first gate line, wherein, in a plan view, a width of the second gate electrode surrounding the contact portion is 1.5 µm or greater.

According to some embodiments, the second gate electrode may extend in the first direction, and the second active pattern may extend in a second direction crossing the first direction, wherein the second active pattern and the second gate electrode may at least partially overlap each other, wherein, in a plan view, a distance between the contact portion and the second active pattern may be 1.3 µm or greater.

According to some embodiments, a width of the contact portion along a second direction crossing the first direction may be greater than the width of the second gate electrode surrounding the contact portion.

According to some embodiments, the insulating layer may include at least two insulating layers.

According to some embodiments, the substrate may include a display area and a peripheral area outside the display area, wherein the display device may further include a first pixel including a first pixel circuit and a second pixel including a second pixel circuit, wherein the first pixel and the second pixel may be adjacent to each other in the display area, wherein the first pixel circuit may include the first active pattern, the first gate electrode, the second active pattern, and the second gate electrode, wherein the first pixel circuit and the second pixel circuit may be symmetrical with respect to the contact portion.

According to some embodiments, the second pixel circuit may include a third active pattern arranged above the substrate, a third gate electrode arranged above the third active pattern, a fourth active pattern arranged above the third gate electrode, and a fourth gate electrode arranged above the fourth active pattern, wherein the second gate electrode and the fourth gate electrode may include an integral gate pattern.

According to some embodiments, the gate pattern may be isolated from other patterns arranged on a same layer as the gate pattern.

According to some embodiments, the contact portion may be at a center of the gate pattern.

According to some embodiments, the display device may further include a power line extending in a second direction crossing the first direction, wherein the power wire may be shared between the first pixel circuit and the second pixel circuit.

According to some embodiments, the first active pattern and the third active pattern may be arranged on a same layer as each other and may include a silicon semiconductor material.

According to some embodiments, the second active pattern and the fourth active pattern may be integral to each other.

According to some embodiments, the second active pattern and the fourth active pattern may include an oxide semiconductor material.

According to some embodiments, the display device may further include a data transfer line which bypasses a portion of the display area and to which a data signal is applied.

According to some embodiments, the data transfer line may include a first connection line arranged above the second gate electrode and extending in the first direction and a second connection line arranged above the first connection line and extending in a second direction crossing the first direction, wherein the first connection line and the second connection line may be electrically connected to each other through a connection contact portion.

According to some embodiments, a same data signal may be applied to the first connection line and the second connection line.

According to some embodiments, the display device may further include a first input line, a second input line, and a third input line sequentially arranged in the peripheral area in a direction from an edge of the peripheral area to a center of the peripheral area, a first data line connected to the first input line, a third data line arranged on one side of the first data line and connected to the third input line, and a second data line arranged on the other side of the first data line and electrically connected to the second input line through the first connection line and the second connection line.

According to some embodiments, the first connection line may not be electrically connected to the first data line and may at least partially overlap the first data line.

According to some embodiments, the first to third data lines and the second connection line may be arranged on a same layer as each other.

According to some embodiments, the display device may further include a fifth gate line extending in the first direction and at least partially overlapping the second active pattern.

According to some embodiments, the fifth gate line may be arranged on a same layer as the second gate electrode.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
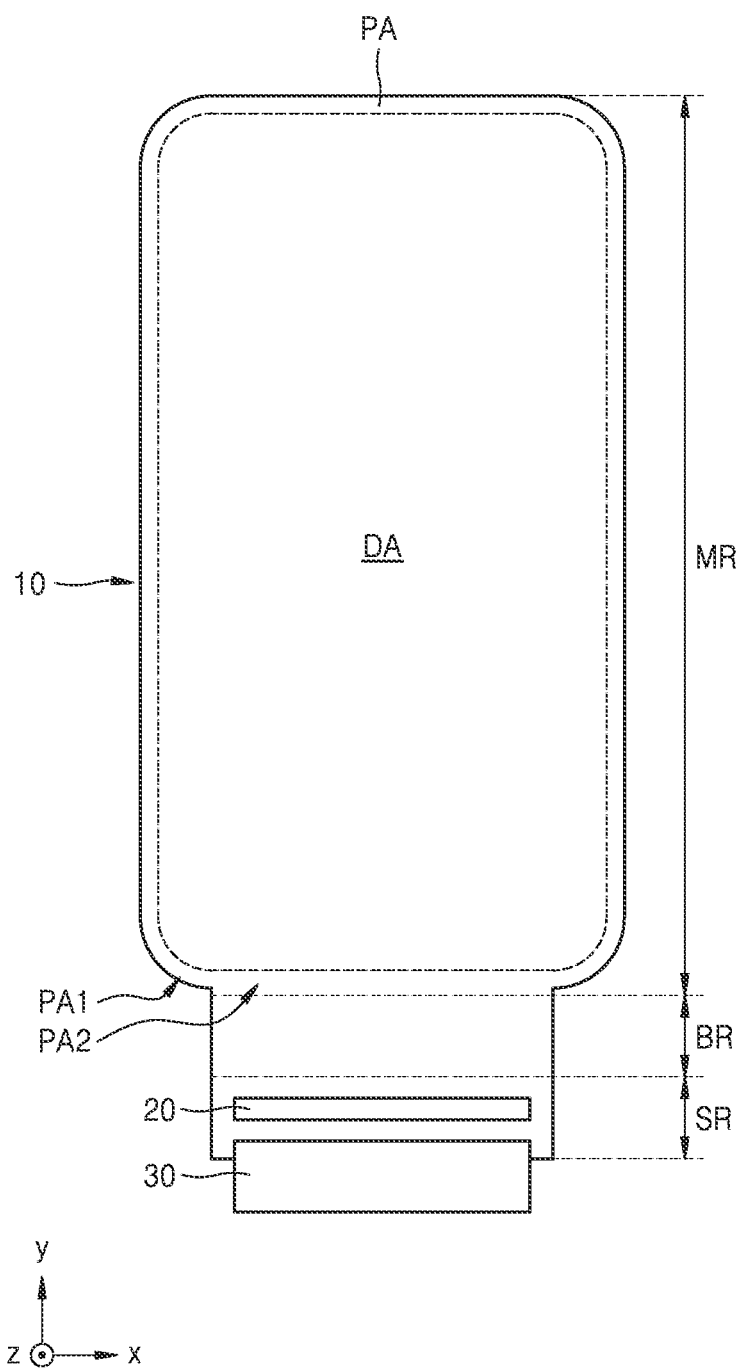
FIG. 1 is a schematic plan view of a portion of a display device according to some embodiments.

Reference will now be made in more detail to aspects of some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

One or more embodiments will be described below in more detail with reference to the accompanying drawings. Those elements that are the same or are in correspondence with each other are rendered the same reference numeral regardless of the figure number, and redundant descriptions thereof are omitted.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "include," "comprise," and "have" as used herein specify the presence of stated features or elements but do not preclude the addition of one or more other features or elements.

It will be further understood that, when a layer, region, or element is referred to as being on another layer, region, or element, it may be directly or indirectly on the other layer, region, or element. That is, for example, intervening layers, regions, or elements may be present.

It will be further understood that, when layers, regions, or elements are referred to as being connected to each other, they may be directly connected to each other or indirectly connected to each other with intervening layers, regions, or elements therebetween. For example, when layers, regions, or elements are referred to as being electrically connected to each other, they may be directly electrically connected to each other or indirectly electrically connected to each other with intervening layers, regions, or elements therebetween.

As used herein, the expression "A and/or B" refers to A, B, or A and B. In addition, the expression "at least one of A and B" refers to A, B, or A and B.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When an embodiment may be implemented differently, a certain process order may be performed differently from the described order. For example, two consecutively described processes may be performed substantially at the same time or performed in an order opposite to the described order.

Sizes of elements in the drawings may be exaggerated or reduced for convenience of description. In other words, because sizes and thicknesses of elements in the drawings are arbitrarily illustrated for convenience of description, the following embodiments are not limited thereto.

Figure 2:
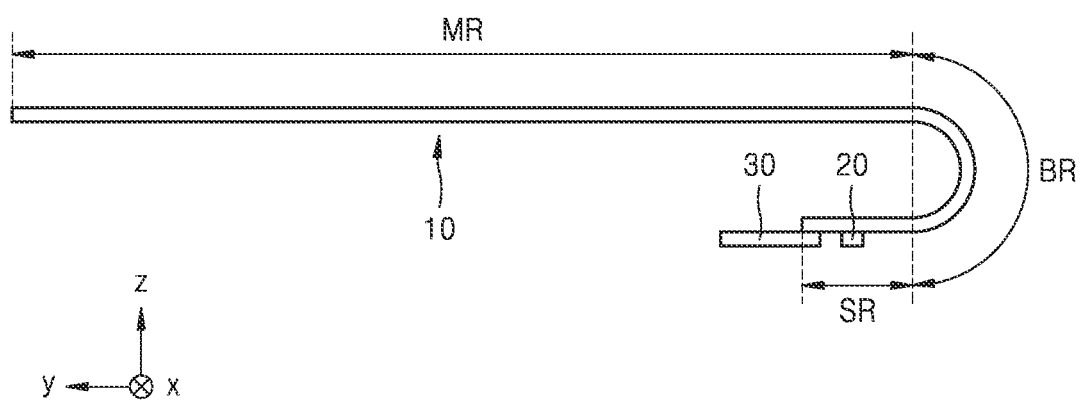
FIG. 2 is a schematic side view of the display device of FIG. 1 according to some embodiments.

FIG. 1 is a schematic plan view of a portion of a display device according to some embodiments, and FIG. 2 is a schematic side view of the display device of FIG. 1. The display device according to the embodiments illustrated in FIG. 2 is partially bent as shown in FIG. 2 but is shown in FIG. 1 as being not bent for convenience.

Referring to FIGS. 1 and 2, the display device includes a display panel 10. Examples of the display device may include any device including the display panel 10. For example, the display device may be any of various products such as a smartphone, a tablet, a laptop, a television, or a billboard.

The display panel 10 includes a display area DA and a peripheral area PA outside the display area DA. The display area DA is an area that displays images, and a plurality of pixels may be arranged therein. The display area DA may have various shapes, for example, a circular shape, an oval shape, a polygonal shape, or a shape of a certain figure. FIG. 1 shows the display area DA having a substantially rectangular shape with rounded corners.

The peripheral area PA may be arranged outside the display area DA (e.g., a bezel area or an area that does not display images). The peripheral area PA may include a first peripheral area PA1 surrounding at least a portion of the display area DA and a second peripheral area PA2 extending from one side of the display area DA (e.g., in a direction −y). A width of the second peripheral area PA2 along one direction (e.g., an x-axis direction) may be less than that of the display area DA. Through such a structure, it may be easy to bend at least a portion of the second peripheral area PA2.

Because the display panel 10 includes a substrate 100 (refer to FIG. 3), the substrate 100 may be said to have the display area DA and the peripheral area PA described above. Hereinafter, for convenience, the substrate 100 will be described as having the display area DA and the peripheral area PA.

The display panel 10 may also be said to have a main region MR, a bending region BR outside the main region MR, and a sub-region SR opposite the main region MR with respect to the bending region BR. The display panel 10 may be bent in the bending region BR as shown in FIG. 2, and thus, at least a portion of the sub-region SR may overlap the main area MR in a z-axis direction. However, embodiments according to the present disclosure are not limited to a bent display device and may be applied to a display device that is not bent. The sub-region SR may be a non-display area as described later. By bending the display panel 10 in the bending region BR, the non-display area may be invisible when the display device is viewed from the front (in a direction −z), or even when the non-display area is visible, a visible area thereof may be reduced.

A data pad portion 20 may be arranged in the sub-region SR of the display panel 10. The data pad portion 20 may include an integrated circuit (e.g., a driving chip) that drives the display panel 10. While the integrated circuit may be a data driving integrated circuit that generates a data signal, embodiments according to the present disclosure are not limited thereto.

The data pad portion 20 may be mounted in the sub-region SR of the display panel 10. The data pad portion 20 is mounted on the same surface as a display surface of the display area DA; however, as the display panel 10 is bent in the bending region BR as described above, the data pad portion 20 may be arranged on the back of the main region MR. The data pad portion 20 may include a plurality of pads.

A printed circuit board 30 may be attached to an end of the sub-region SR of the display panel 10. The printed circuit board 30 may be electrically connected to the data pad portion 20 through the pads.

Although an organic light-emitting display device is described below as an example of a display device according to some embodiments, a display device described herein is not limited thereto. According to some embodiments, the display device described herein may be a display device such as an inorganic light-emitting display device (or an inorganic electroluminescent (EL) display device) or a quantum dot light-emitting display device. For example, an emission layer of a display element included in the display device may include an organic material, may include an inorganic material, may include quantum dots, may include an organic material and quantum dots, or may include an inorganic material and quantum dots.

Figure 3:
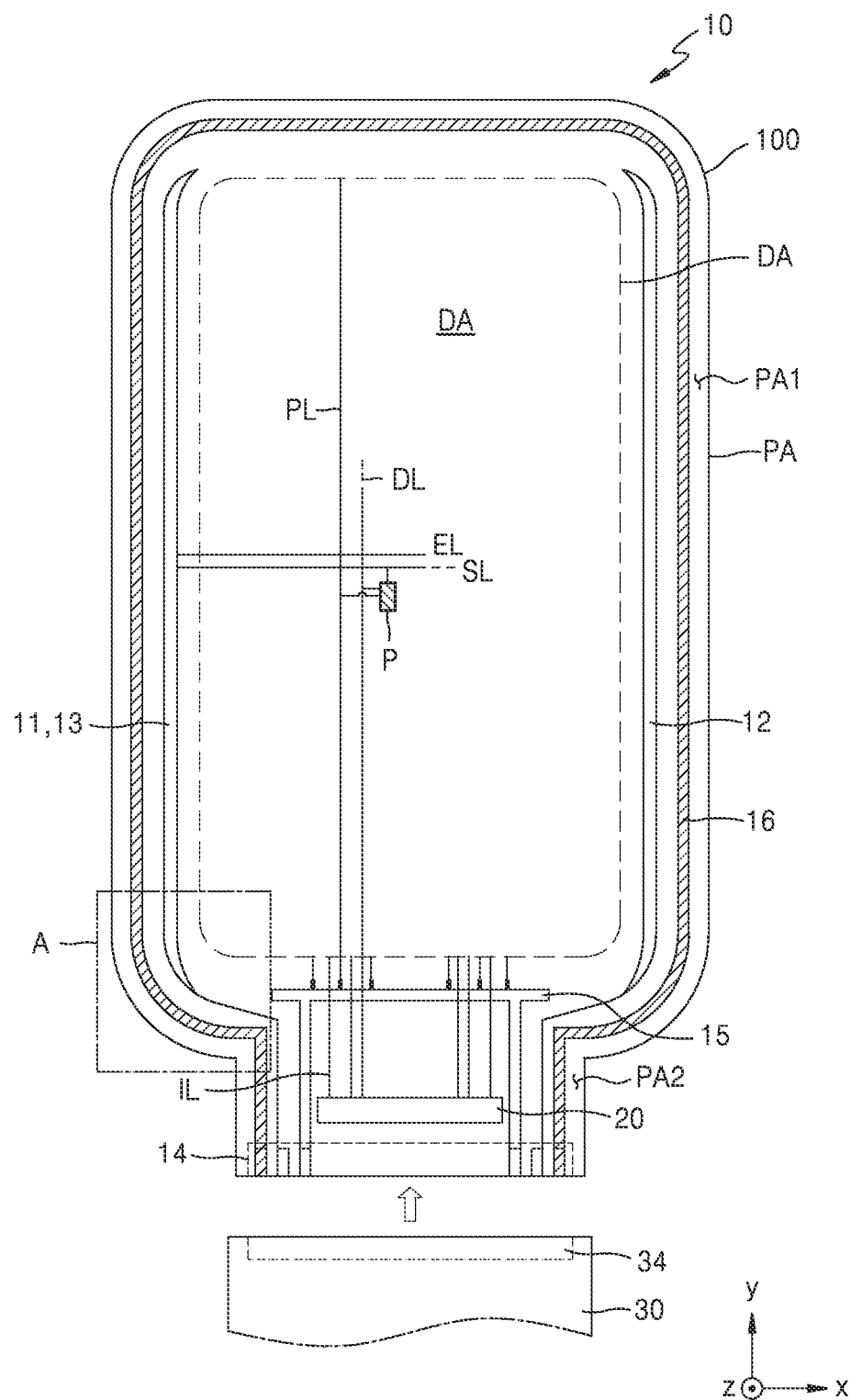
FIG. 3 is a schematic plan view of a display panel according to some embodiments.

FIG. 3 is a schematic plan view of the display panel 10 according to some embodiments.

Referring to FIG. 3, the display panel 10 includes the substrate 100. Various elements constituting the display panel 10 are arranged over the substrate 100. The substrate 100 may include glass, metal, or polymer resin. When the display panel 10 is bent in the bending region BR as described above, the substrate 100 may be flexible or bendable. In this case, the substrate 100 may include, for example, polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 may be variously modified, for example, to have a multilayer structure including two layers each including the polymer resin described above and a barrier layer including an inorganic material (e.g., silicon oxide, silicon nitride, silicon oxynitride, etc.) between the two layers.

A plurality of pixels P are arranged in the display area DA. Each pixel P refers to a sub-pixel and may be implemented by a display element such as an organic light-emitting diode. A pixel P may emit, for example, red, green, blue, or white light.

The pixel P may be electrically connected to outer circuits arranged in the peripheral area PA. A first scan driving circuit 11, a second scan driving circuit 12, an emission control driving circuit 13, a terminal 14, a first power supply line 15, and a second power supply line 16 may be arranged in the peripheral area PA.

The first scan driving circuit 11 may provide a scan signal to the pixel P through a scan line SL. The second scan driving circuit 12 may be parallel to the first scan driving circuit 11 with the display area DA therebetween. Some of the pixels P arranged in the display area DA may be electrically connected to the first scan driving circuit 11, and the others may be connected to the second scan driving circuit 12. According to some embodiments, the second scan driving circuit 12 may be omitted.

The emission control driving circuit 13 may be arranged on the side of the first scan driving circuit 11 and may provide an emission control signal to the pixel P through an emission control line EL. Although FIG. 3 shows the emission control driving circuit 13 arranged only on one side of the display area DA, the emission control driving circuit 13 may be arranged on both sides of the display area DA like the first and second scan driving circuits 11 and 12.

The terminal 14 may be arranged in the second peripheral area PA2 of the substrate 100. The terminal 14 may not be covered by an insulating layer but may be exposed and be electrically connected to the printed circuit board 30. A terminal 34 of the printed circuit board 30 may be electrically connected to the terminal 14 of the display panel 10.

The printed circuit board 30 transmits a signal or power of a controller to the display panel 10. Control signals generated by the controller may be transmitted to driving circuits, for example, the first scan driving circuit 11, the second scan driving circuit 12, and the emission control driving circuit 13, respectively, through the printed circuit board 30. In addition, the controller may provide first and second power voltages ELVDD and ELVSS (refer to FIG. 6) to the first and second power supply lines 15 and 16, respectively. The first power voltage (or a driving voltage) ELVDD may be provided to each pixel P through a driving voltage line PL connected to the first power supply line 15, and the second power voltage (or a common voltage) ELVSS may be provided to an opposite electrode of the pixel P connected to the second power supply line 16. The first power supply line 15 may extend in one direction (e.g., a direction x) on a lower side of the display area DA. The second power supply line 16 may have a loop shape with one side open and thus may partially surround the display area DA.

In addition, the controller may generate a data signal, and the generated data signal may be transmitted to an input line IL through the data pad portion 20 and may be transmitted to the pixel P through a data line DL connected to the input line IL.

Figure 4:
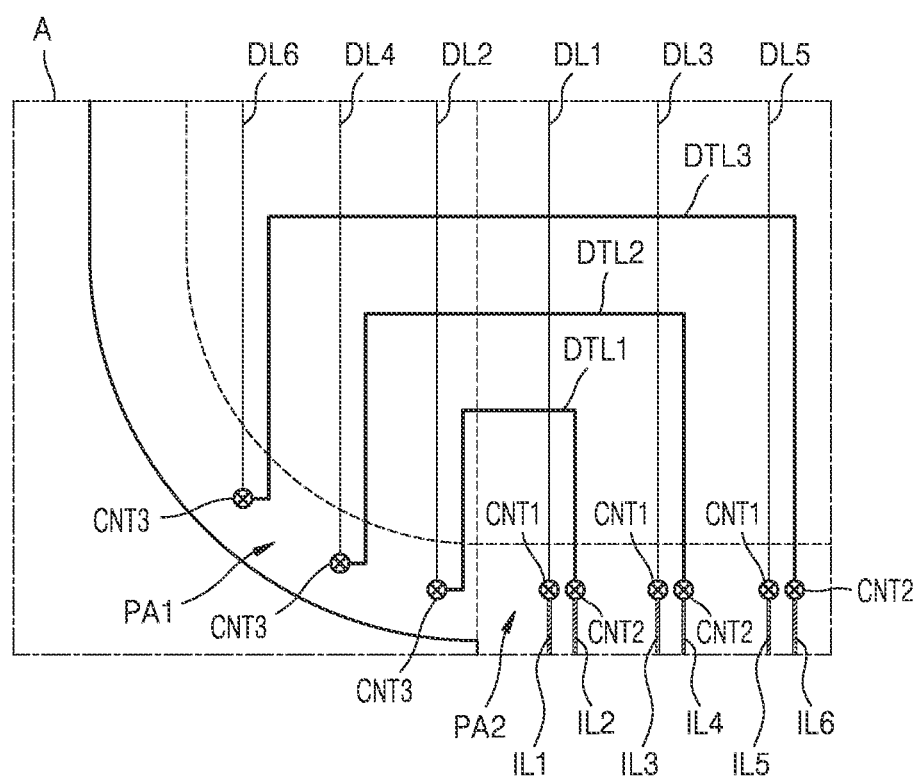
FIGS. 4 and 5 are schematic enlarged plan views of area A of FIG. 3 according to some embodiments.
Figure 5:
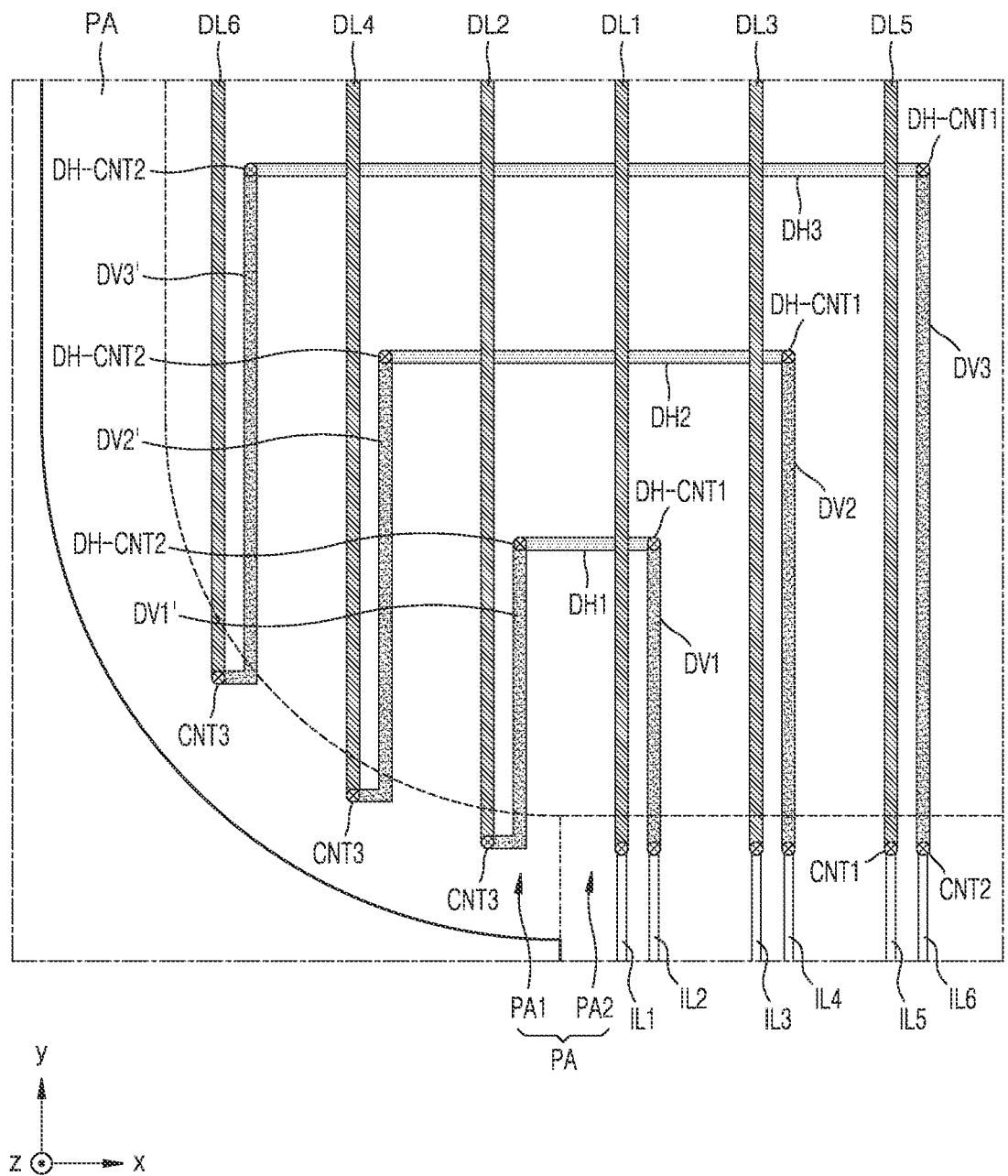

FIGS. 4 and 5 are schematic enlarged plan views of area A of FIG. 3.

Referring to FIG. 4, various signals may be applied to the display area DA. For example, a data signal for adjusting brightness of each pixel may be applied to the display area DA. To this end, as shown in FIG. 4, over the substrate 100, data lines, for example, first to sixth data lines DL1 to DL6, substantially parallel to one another may be arranged in the display area DA. Various wires (or lines) such as a power line or a scan line other than the data lines, for example, the first to sixth data lines DL1 to DL6, may be arranged inside and outside the display area DA.

First to sixth input lines IL1 to IL6 connected to the data pad portion 20 to receive a data signal may be arranged in the peripheral area PA, that is, the second peripheral area PA2. The first to sixth data lines DL1 to DL6 may be connected to the first to sixth input lines IL1 to IL6 to transmit the data signal to each pixel.

For convenience of description, FIGS. 4 and 5 show six input lines and six data lines; substantially, however, the number of input lines and data lines may be greater.

The first to sixth input lines IL1 to IL6 may be sequentially arranged in a direction from the edge of the second peripheral area PA2 to the center of the second peripheral area PA2. According to some embodiments, the first, third, and fifth input lines IL1, IL3, and IL5 arranged in odd-numbered places may be respectively connected to the first, third, and fifth data lines DL1, DL3, and DL5 consecutively neighboring one another. The first, third, and fifth input lines IL1, IL3, and IL5 may be integrally formed with the first, third, and fifth data lines DL1, DL3, and DL5, or may be connected thereto through a first contact hole CNT1 as shown in FIG. 4. The first, third, and fifth data lines DL1, DL3, and DL5 may be configured to receive data signals from the first, third, and fifth input lines IL1, IL3, and IL5, respectively.

Through first to third data transfer lines DTL1 to DTL3, the second, fourth, and sixth input lines IL2, IL4, and IL6 arranged in even-numbered places may be respectively connected to the second, fourth, and sixth data lines DL2, DL4, and DL6 consecutively neighboring one another. That is, the second, fourth, and sixth data lines DL2, DL4, and DL6 may be configured to receive data signals from the second, fourth, and sixth input lines IL2, IL4, and IL6, respectively, through the first to third data transfer lines DTL1 to DTL3.

The first to third data transfer lines DTL1 to DTL3 may pass through the display area DA by bypassing a portion of the display area DA adjacent to the peripheral area PA. The second input line IL2 is electrically connected to the second data line DL2 through the first data transfer line DTL1, the fourth input line IL4 is electrically connected to the fourth data line DL4 through the second data transfer line DTL2, and the sixth input line IL6 is electrically connected to the sixth data line DL6 through the third data transfer line DTL3.

One end of each of the first to third data transfer lines DTL1 to DTL3 may be connected to the second, fourth, and sixth input lines IL2, IL4, and IL6 through a second contact hole CNT2, and the other end of each of the first to third data transfer lines DTL1 to DTL3 may be connected to the second, fourth, and sixth data lines DL2, DL4, and DL6 through a third contact hole CNT3. Although FIGS. 4 and 5 show the second contact hole CNT2 and the third contact hole CNT3 in the peripheral area PA, embodiments according to the present disclosure are not limited thereto. According to some embodiments, the second contact hole CNT2 and/or the third contact hole CNT3 may be in the display area DA. Thus, the second input line IL2 may be configured to transmit a data signal to the second data line DL2, the fourth input line IL4 may be configured to transmit a data signal to the fourth data line DL4, and the sixth input line IL6 may be configured to transmit a data signal to the sixth data line DL6.

Referring to FIG. 5, a connection relationship at the perimeter of the display area DA in which the first to third data transfer lines DTL1 to DTL3 are arranged is shown. FIG. 5 may be understood as a detailed illustration of FIG. 4 described above.

Referring to FIG. 5, the second, fourth, and sixth input lines IL2, IL4, and IL6 may be electrically connected to the second, fourth, and sixth data lines DL2, DL4, and DL6 through the first to third data transfer lines DTL1 to DTL3, respectively.

According to some embodiments, the first to third data transfer lines DTL1 to DTL3 are shown to include first connection lines DH1 to DH3, second connection lines DV1 to DV3, and third connection lines DV1' to DV3', respectively. The first connection lines DH1 to DH3 may extend in a first direction (e.g., a direction x) crossing a second direction (e.g., a direction y), and the second connection lines DV1 to DV3 and the third connection lines DV1' to DV3' may extend in the second direction (e.g., the direction y) substantially parallel to the data line DL.

The second, fourth, and sixth input lines IL2, IL4, and IL6 may be connected to the second connection lines DV1 to DV3, respectively, through the second contact hole CNT2, and the third connection lines DV1' to DV3' may be connected to the second, fourth, and sixth data lines DL2, DL4, and DL6, respectively, through the third contact hole CNT3.

The first connection lines DH1 to DH3 may be connected to the second connection lines DV1 to DV3 and the third connection lines DV1' to DV3' through a first connection contact portion DH-CNT1 and a second connection contact portion DH-CNT2 respectively arranged at one end and the other end of the first connection lines DH1 to DH3.

According to some embodiments, the first connection lines DH1 to DH3, the second connection lines DV1 to DV3, and the third connection lines DV1' to DV3' may be arranged on the same layer as one another, or at least some thereof may be arranged on a different layer. For example, the second connection lines DV1 to DV3 and the third connection lines DV1' to DV3' may be arranged on the same layer as each other, and the first connection lines DH1 to DH3 may be arranged on a different layer. In this regard, being arranged on the same layer may mean being formed simultaneously through the same mask process and including the same material. As described above, when the second connection lines DV1 to DV3 and the third connection lines DV1' to DV3' are arranged on the same layer as each other, the second connection lines DV1 to DV3 and the third connection lines DV1' to DV3' may be arranged on the same layer as the data line DL.

The first connection lines DH1 to DH3 may overlap some of the first to sixth data lines DL1 to DL6. The first connection lines DH1 to DH3 may pass below the first to sixth data lines DL1 to DL6. The first connection lines DH1 to DH3 may include a 1-1 connection line DH1, a 1-2 connection line DH2 and a 1-3 connection line DH3. For example, as shown in FIG. 5, the 1-1 connection line DH1 may partially overlap the first data line DL1, the 1-2 connection line DH2 may partially overlap the first to third data lines DL1 to DL3, and the 1-3 connection line DH3 may partially overlap the first to fifth data lines DL1 to DL5.

According to some embodiments, a dummy line may be further arranged on the same layer as each of the first connection lines DH1 to DH3, the second connection lines DV1 to DV3, and the third connection lines DV1' to DV3'. The dummy line is continuously formed with each of the first connection lines DH1 to DH3, the second connection lines DV1 to DV3, and the third connection lines DV1' to DV3' and is electrically disconnected in some areas to configure the first to third data transfer lines DTL1 to DTL3. The disconnected portion may be arranged around the first connection contact portion DH-CNT1 and the second connection contact portion DH-CNT2 described above. The dummy line may be in the form of a floating electrode isolated from other electrodes and/or wires (or lines), and a signal or a constant voltage may be applied thereto to prevent static electricity.

Figure 6:
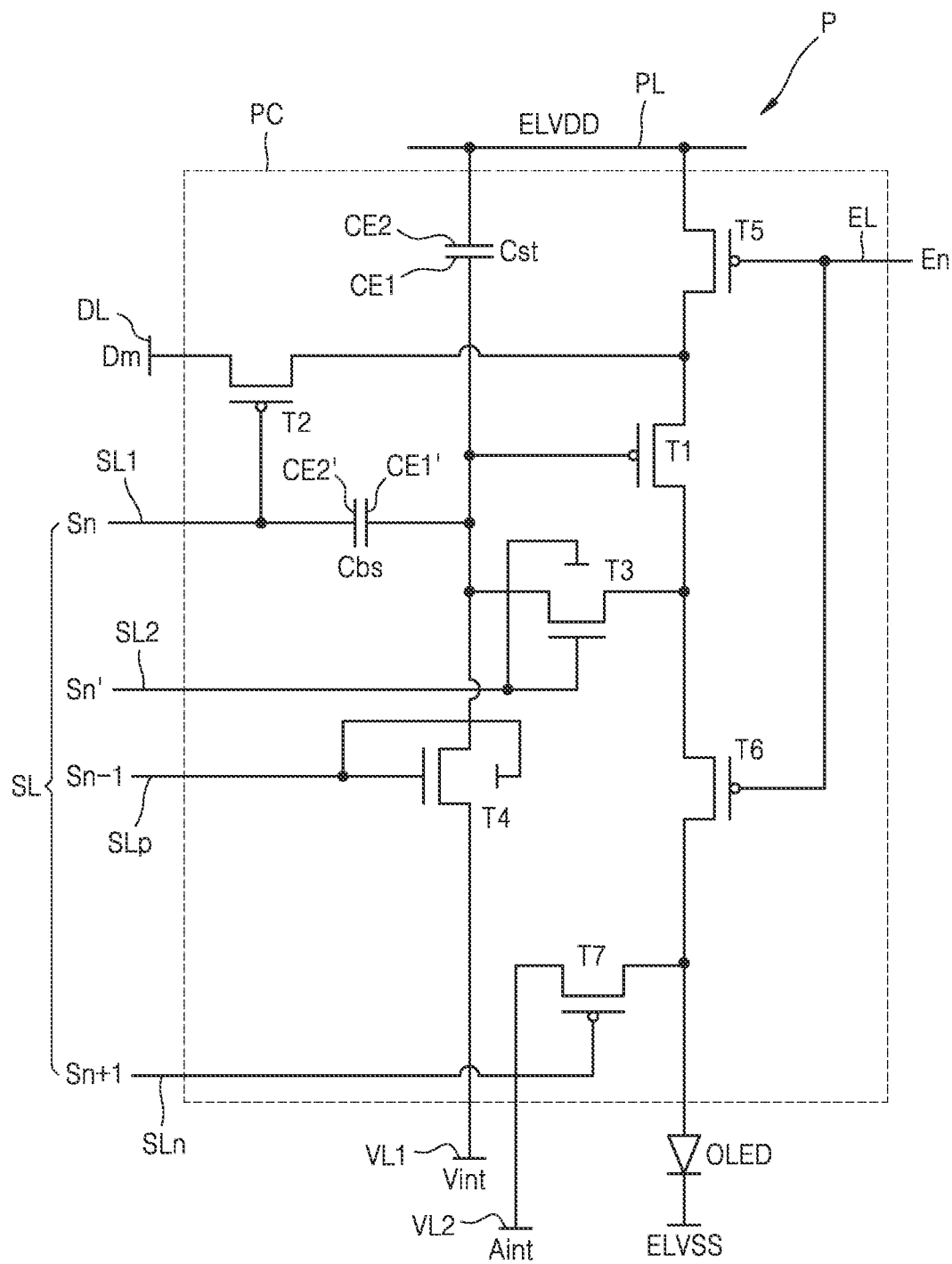
FIG. 6 is an equivalent circuit diagram of a pixel included in a display device according to some embodiments.

FIG. 6 is an equivalent circuit diagram of the pixel P included in a display device according to some embodiments.

Referring to FIG. 6, the pixel P may include a pixel circuit PC and an organic light-emitting diode OLED.

As an example, the pixel circuit PC may include a plurality of thin-film transistors, for example, a driving thin-film transistor T1 to a second initialization thin-film transistor T7, and a storage capacitor Cst. The plurality of thin-film transistors, for example, the driving thin-film transistor T1 to the second initialization thin-film transistor T7, and the storage capacitor Cst may be connected to signal lines, for example, a first scan line SL1, a second scan line SL2, a previous scan line SLp, a next scan line SLn, the emission control line EL, and the data line DL, a first initialization voltage line VL1, a second initialization voltage line (or an anode initialization voltage line) VL2, and the driving voltage line PL. According to some embodiments, at least one of the lines described above, for example, the driving voltage line PL, may be shared by neighboring pixels P.

The plurality of thin-film transistors, for example, the driving thin-film transistor T1 to the second initialization thin-film transistor T7, may include the driving thin-film transistor T1, a switching thin-film transistor T2, a compensation thin-film transistor T3, a first initialization thin-film transistor T4, an operation control thin-film transistor T5, an emission control thin-film transistor T6, and the second initialization thin-film transistor T7.

The organic light-emitting diode OLED may include a first electrode (e.g., an anode electrode) and a second electrode (e.g., a cathode electrode), and a first terminal of the organic light-emitting diode OLED may be connected to the driving thin-film transistor T1 through the emission control thin-film transistor T6 to receive a driving current, and a second terminal of the organic light-emitting diode OLED may receive the low power voltage ELVSS. The organic light-emitting diode OLED may generate light having brightness corresponding to the driving current.

Some of the plurality of thin-film transistors, for example, the driving thin-film transistor T1 to the second initialization thin-film transistor T7, may be NMOS transistors (n-channel MOSFETs), and the others may be PMOS transistors (p-channel MOSFETs). For example, the compensation thin-film transistor T3 and the first initialization thin-film transistor T4 from among the plurality of thin-film transistors, for example, the driving thin-film transistor T1 to the second initialization thin-film transistor T7, may be NMOS transistors (n-channel MOSFETs), and the others may be PMOS transistors (p-channel MOSFETs).

According to some embodiments, the compensation thin-film transistor T3, the first initialization thin-film transistor T4, and the second initialization thin-film transistor T7 from among the plurality of thin-film transistors, for example, the driving thin-film transistor T1 to the second initialization thin-film transistor T7, may be NMOS transistors, and the others may be PMOS transistors. Alternatively, only one of the plurality of thin-film transistors, for example, the driving thin-film transistor T1 to the second initialization thin-film transistor T7, may be an NMOS transistor, and the others may be PMOS transistors. Alternatively, all of the plurality of thin-film transistors, for example, the driving thin-film transistor T1 to the second initialization thin-film transistor T7, may be NMOS transistors.

The signal lines may include the first scan line SL1 configured to transmit a first scan signal Sn, the second scan line SL2 configured to transmit a second scan signal Sn', the previous scan line SLp configured to transmit a previous scan signal Sn−1 to the first initialization thin-film transistor T4, the emission control line EL configured to transmit an emission control signal En to the operation control thin-film transistor T5 and the emission control thin-film transistor T6, the next scan line SLn configured to transmit a next scan signal Sn+1 to the second initialization thin-film transistor T7, and the data line DL crossing the first scan line SL1 and configured to transmit a data signal Dm.

The driving voltage line PL may be configured to transfer the driving voltage ELVDD to the driving thin-film transistor T1, and the first initialization voltage line VL1 may be configured to transfer an initialization voltage Vint for initializing the driving thin-film transistor T1 and a pixel electrode.

A driving gate electrode of the driving thin-film transistor T1 may be connected to the storage capacitor Cst, a driving source region of the driving thin-film transistor T1 may be connected to the driving voltage line PL via the operation control thin-film transistor T5, and a driving drain region of the driving thin-film transistor T1 may be electrically connected to the pixel electrode of the organic light-emitting diode OLED via the emission control thin-film transistor T6. The driving thin-film transistor T1 may receive the data signal Dm according to a switching operation of the switching thin-film transistor T2 and supply a driving current IDLED to the organic light-emitting diode OLED.

A switching gate electrode of the switching thin-film transistor T2 may be connected to the first scan line SL1 configured to transmit the first scan signal Sn, a switching source region of the switching thin-film transistor T2 may be connected to the data line DL, and a switching drain region of the switching thin-film transistor T2 may be connected to the driving source region of the driving thin-film transistor T1 and may also be connected to the driving voltage line PL via the operation control thin-film transistor T5. The switching thin-film transistor T2 may be turned on according to the first scan signal Sn received through the first scan line SL1 to perform a switching operation for transmitting the data signal Dm transmitted through the data line DL to the driving source region of the driving thin-film transistor T1.

A compensation gate electrode of the compensation thin-film transistor T3 is connected to the second scan line SL2. A compensation drain region of the compensation thin-film transistor T3 may be connected to the driving drain region of the driving thin-film transistor T1 and may also be connected to the pixel electrode of the organic light-emitting diode OLED via the emission control thin-film transistor T6 A compensation source region of the compensation thin-film transistor T3 may be connected to a first electrode CE1 of the storage capacitor Cst and the driving gate electrode of the driving thin-film transistor T1. In addition, the compensation source region may be connected to a first initialization drain region of the first initialization thin-film transistor T4.

The compensation thin-film transistor T3 may be turned on according to the second scan signal Sn' received through the second scan line SL2 to diode-connect the driving thin-film transistor T1 by electrically connecting the driving gate electrode and the driving drain region of the driving thin-film transistor T1 to each other.

A first initialization gate electrode of the first initialization thin-film transistor T4 may be connected to the previous scan line SLp. A first initialization source region of the first initialization thin-film transistor T4 may be connected to a second initialization source region of the second initialization thin-film transistor T7 and the first initialization voltage line VL1. The first initialization drain region of the first initialization thin-film transistor T4 may be connected to the first electrode CE1 of the storage capacitor Cst, the compensation source region of the compensation thin-film transistor T3, and the driving gate electrode of the driving thin-film transistor T1. The first initialization thin-film transistor T4 may be turned on according to the previous scan signal Sn−1 received through the previous scan line SLp to perform an initialization operation for initializing a voltage of the driving gate electrode of the driving thin-film transistor T1 by transferring the initialization voltage Vint to the driving gate electrode of the driving thin-film transistor T1.

An operation control gate electrode of the operation control thin-film transistor T5 may be connected to the emission control line EL, an operation control source region of the operation control thin-film transistor T5 may be connected to the driving voltage line PL, and an operation control drain region of the operation control thin-film transistor T5 may be connected to the driving source region of the driving thin-film transistor T1 and the switching drain region of the switching thin-film transistor T2.

An emission control gate electrode of the emission control thin-film transistor T6 may be connected to the emission control line EL, an emission control source region of the emission control thin-film transistor T6 may be connected to the driving drain region of the driving thin-film transistor T1 and the compensation drain region of the compensation thin-film transistor T3, and an emission control drain region of the emission control thin-film transistor T6 may be electrically connected to a second initialization drain region of the second initialization thin-film transistor T7 and the pixel electrode of the organic light-emitting diode OLED.

As the operation control thin-film transistor T5 and the emission control thin-film transistor T6 are simultaneously (or concurrently) turned on according to the emission control signal En received through the emission control line EL, the driving voltage ELVDD is transferred to the organic light-emitting diode OLED so that the driving current IDLED flows through the organic light-emitting diode OLED.

A second initialization gate electrode of the second initialization thin-film transistor T7 may be connected to the next scan line SLn, the second initialization drain region of the second initialization thin-film transistor T7 may be connected to the emission control drain region of the emission control thin-film transistor T6 and the pixel electrode of the organic light-emitting diode OLED, and the second initialization source region of the second initialization thin-film transistor T7 may be connected to the second initialization voltage line VL2 to receive an anode initialization voltage Aint. The second initialization thin-film transistor T7 may be turned on according to the next scan signal Sn+1 received through the next scan line SLn to initialize the pixel electrode of the organic light-emitting diode OLED.

As shown in FIG. 6, the second initialization thin-film transistor T7 may be connected to the next scan line SLn. According to some embodiments, the second initialization thin-film transistor T7 may be connected to the emission control line EL and be driven according to the emission control signal En. Locations of the source regions and the drain regions may be switched with each other according to the types of transistors (p-type or n-type).

The storage capacitor Cst may include the first electrode CE1 and a second electrode CE2. The first electrode CE1 of the storage capacitor Cst is connected to the driving gate electrode of the driving thin-film transistor T1, and the second electrode CE2 of the storage capacitor Cst is connected to the driving voltage line PL. The storage capacitor Cst may store charges corresponding to a difference between the voltage of the driving gate electrode of the driving thin-film transistor T1 and the driving voltage ELVDD.

A boosting capacitor Cbs may include a first electrode CE1' and a second electrode CE2'. The first electrode CE1' of the boosting capacitor Cbs may be connected to the first electrode CE1 of the storage capacitor Cst, and the second electrode CE2' of the boosting capacitor Cbs may receive the first scan signal Sn. By increasing a voltage of a gate terminal of the driving thin-film transistor T1 at a time when reception of the first scan signal Sn is stopped, the boosting capacitor Cbs may compensate for a voltage drop of the gate terminal.

Further details of some operations of each pixel P according to some embodiments are as follows.

During an initialization period, when the previous scan signal Sn−1 is supplied through the previous scan line SLp, the first initialization thin-film transistor T4 is turned on in response to the previous scan signal Sn−1, and the driving thin-film transistor T1 is initialized by the initialization voltage Vint supplied from the first initialization voltage line VL1.

During a data programming period, when the first scan signal Sn and the second scan signal Sn' are supplied through the first scan line SL1 and the second scan line SL2, the switching thin-film transistor T2 and the compensation thin-film transistor T3 are turned on in response to the first scan signal Sn and the second scan signal Sn'. In this regard, the driving thin-film transistor T1 is diode-connected by the turned-on compensation thin-film transistor T3 and is biased in a forward direction.

Then, a compensation voltage Dm+Vth (where Vth is a (−) value), which is a result of decreasing the data signal Dm supplied from the data line DL by as much as a threshold voltage Vth of the driving thin-film transistor T1, is applied to the driving gate electrode of the driving thin-film transistor T1.

The driving voltage ELVDD and the compensation voltage Dm+Vth are applied to two ends of the storage capacitor Cst, and charges corresponding to a voltage difference between the two ends are stored in the storage capacitor Cst.

During an emission period, the operation control thin-film transistor T5 and the emission control thin-film transistor T6 are turned on by the emission control signal En supplied from the emission control line EL. The driving current IDLED is generated according to a voltage difference between the voltage of the driving gate electrode of the driving thin-film transistor T1 and the driving voltage ELVDD and is supplied to the organic light emitting diode OLED through the emission control thin-film transistor T6.

According to some embodiments, at least one of the plurality of thin-film transistors, for example, the driving thin-film transistor T1 to the second initialization thin-film transistor T7, includes a semiconductor layer including oxide, and the others include a semiconductor layer including silicon.

For example, the driving thin-film transistor T1 that directly affects brightness of a display device may include a semiconductor layer including polycrystalline silicon with high reliability, and thus, a high-resolution display device may be implemented.

Because an oxide semiconductor has high carrier mobility and low leakage current, a voltage drop is not significant even when a driving time is long. That is, low-frequency driving may be performed because the color change of an image due to a voltage drop is not significant even during low-frequency driving.

As described above, the oxide semiconductor has the advantage of low leakage current, and accordingly, at least one of the compensation thin-film transistor T3, the first initialization thin-film transistor T4, or the second initialization thin-film transistor T7 connected to the driving gate electrode of the driving thin-film transistor T1 may be employed as the oxide semiconductor to prevent leakage current that may flow to the driving gate electrode and reduce power consumption.

Figure 7:
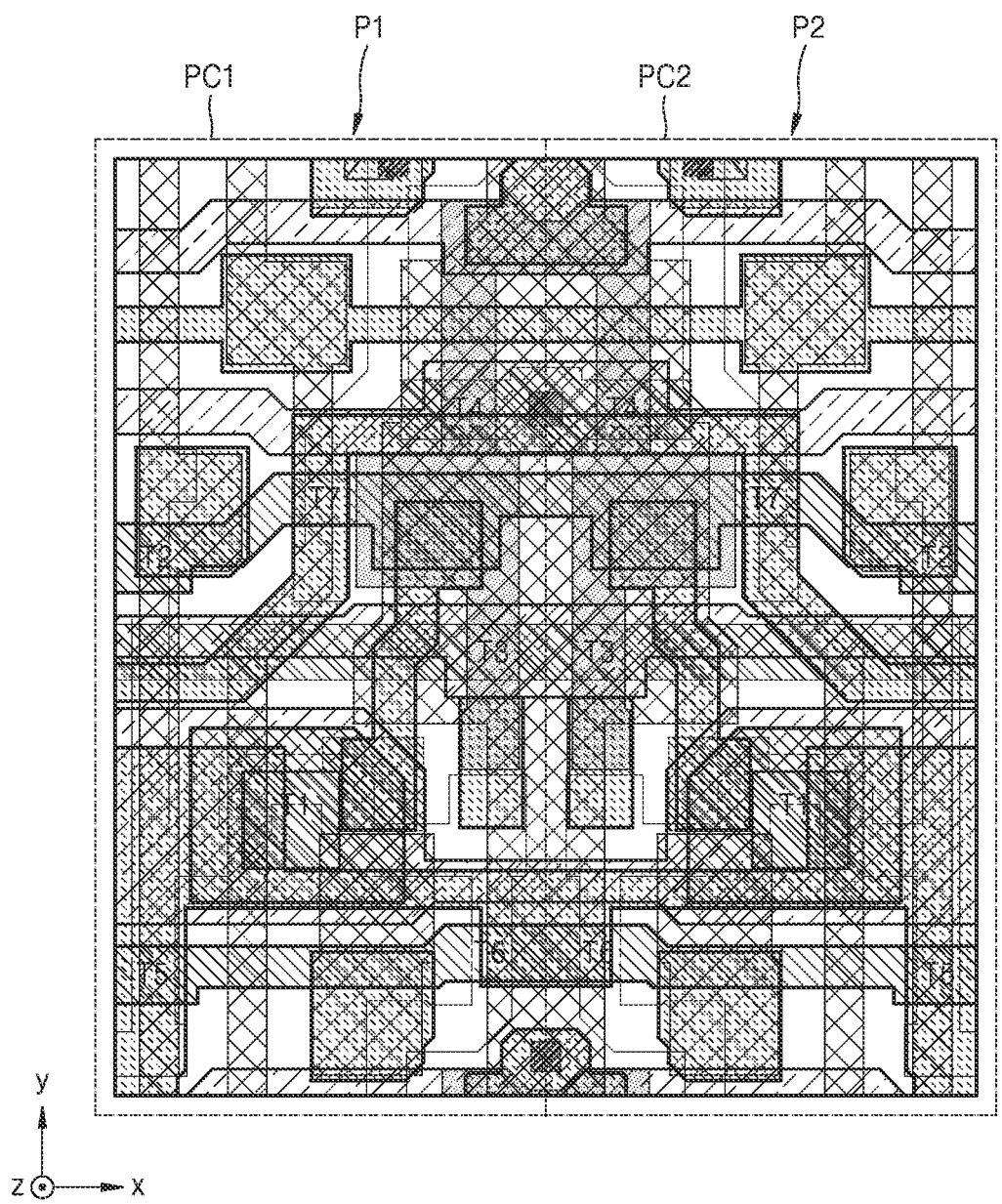
FIG. 7 is a schematic plan view of a structure of a pixel circuit according to some embodiments.

FIG. 7 is a schematic plan view of a structure of a pixel circuit according to some embodiments. FIGS. 8 to 14 are plan views showing conductive patterns constituting the pixel circuit of FIG. 7 for each layer. FIG. 15 is a schematic cross-sectional view of a portion of a structure of a pixel circuit according to some embodiments.

Figure 8:
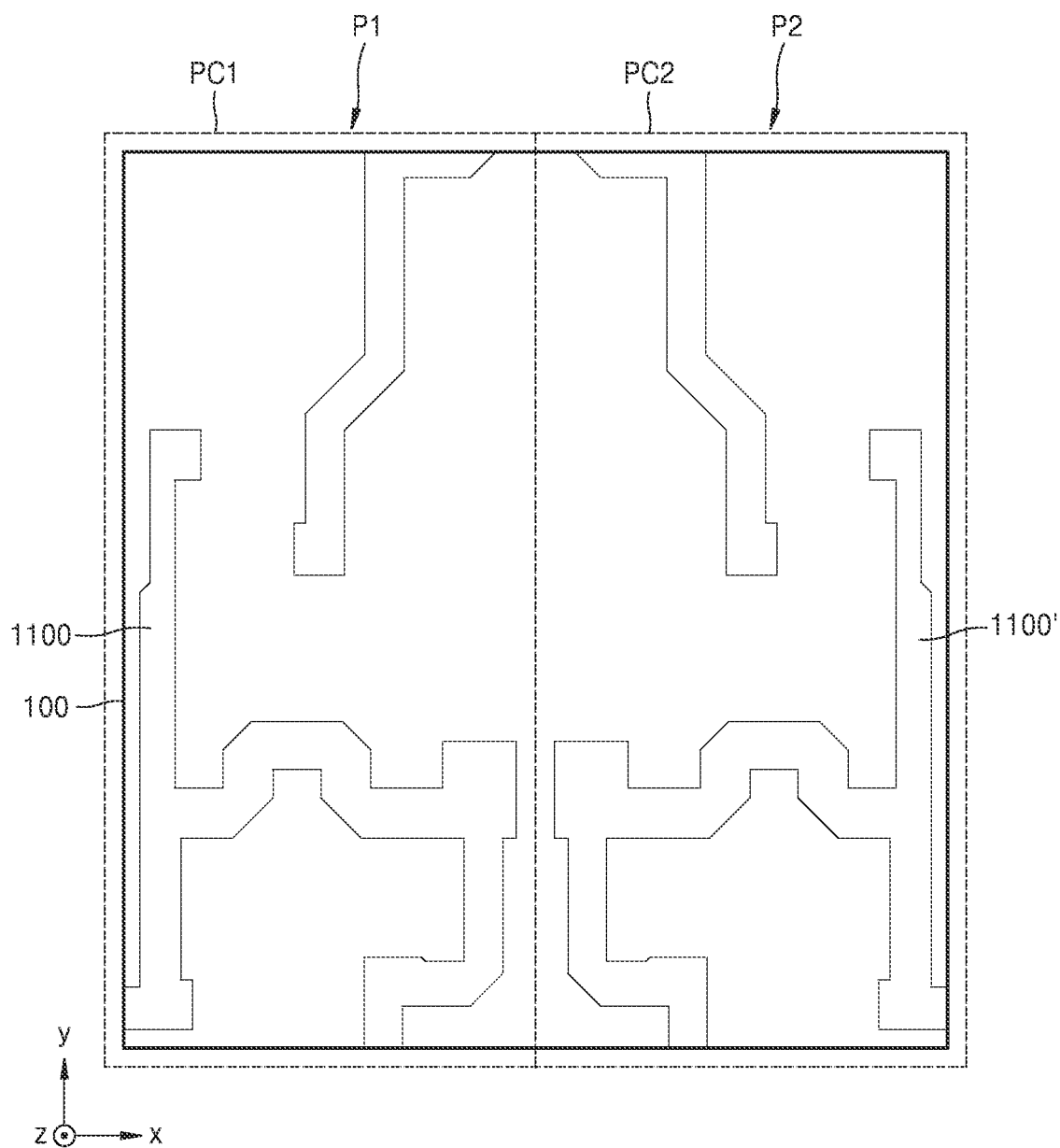
FIGS. 8 to 14 are plan views showing conductive patterns constituting the pixel circuit of FIG. 7 for each layer according to some embodiments.

Referring to FIG. 8 with FIGS. 7 and 15, the display device 1 may include a first pixel P1 and a second pixel P2 adjacent to each other. According to some embodiments, as shown in FIGS. 7 and 8, the first pixel P1 and the second pixel P2 may be symmetrical with respect to a virtual line. According to some embodiments, the first pixel P1 and second pixel P2 may have a structure in which the same pixel structure is continuously repeated instead of the symmetrical structure. The first pixel P1 may include a first pixel circuit PC1, and the second pixel P2 may include a second pixel circuit PC2.

Hereinafter, for convenience of description, some conductive patterns will be described based on the first pixel circuit PC1; however, the conductive patterns are also symmetrically provided in the second pixel circuit PC2.

The substrate 100 may include glass, quartz, plastic, etc. According to some embodiments, the substrate 100 may include plastic, and accordingly, the display device may be flexible. In this case, the substrate 100 may have a structure in which at least one organic film layer and at least one barrier layer are alternately stacked. For example, the organic film layer may be formed using an organic material such as polyimide, and the barrier layer may be formed using an inorganic material.

A buffer layer 111 (refer to FIG. 15) may be arranged on the substrate 100. The buffer layer 111 may prevent diffusion of metal atoms or impurities from the substrate 100 into a first active pattern 1100. In addition, the buffer layer 111 may allow uniform formation of the first active pattern 1100 by adjusting a rate of heat provided during a crystallization process for forming the first active pattern 1100.

The first active pattern 1100 may be arranged on the buffer layer 111. According to some embodiments, the first active pattern 1100 may include a silicon semiconductor. For example, the silicon semiconductor may include amorphous silicon, polycrystalline silicon, etc. For example, the first active pattern 1100 may include low temperature polysilicon (LTPS).

According to some embodiments, ions may be injected into the first active pattern 1100. For example, when the driving thin-film transistor T1, the switching thin-film transistor T2, the operation control thin-film transistor T5, the emission control thin-film transistor T6, and the second initialization thin-film transistor T7 are the PMOS transistors, ions such as boron may be injected into the first active pattern 1100.

Figure 9:
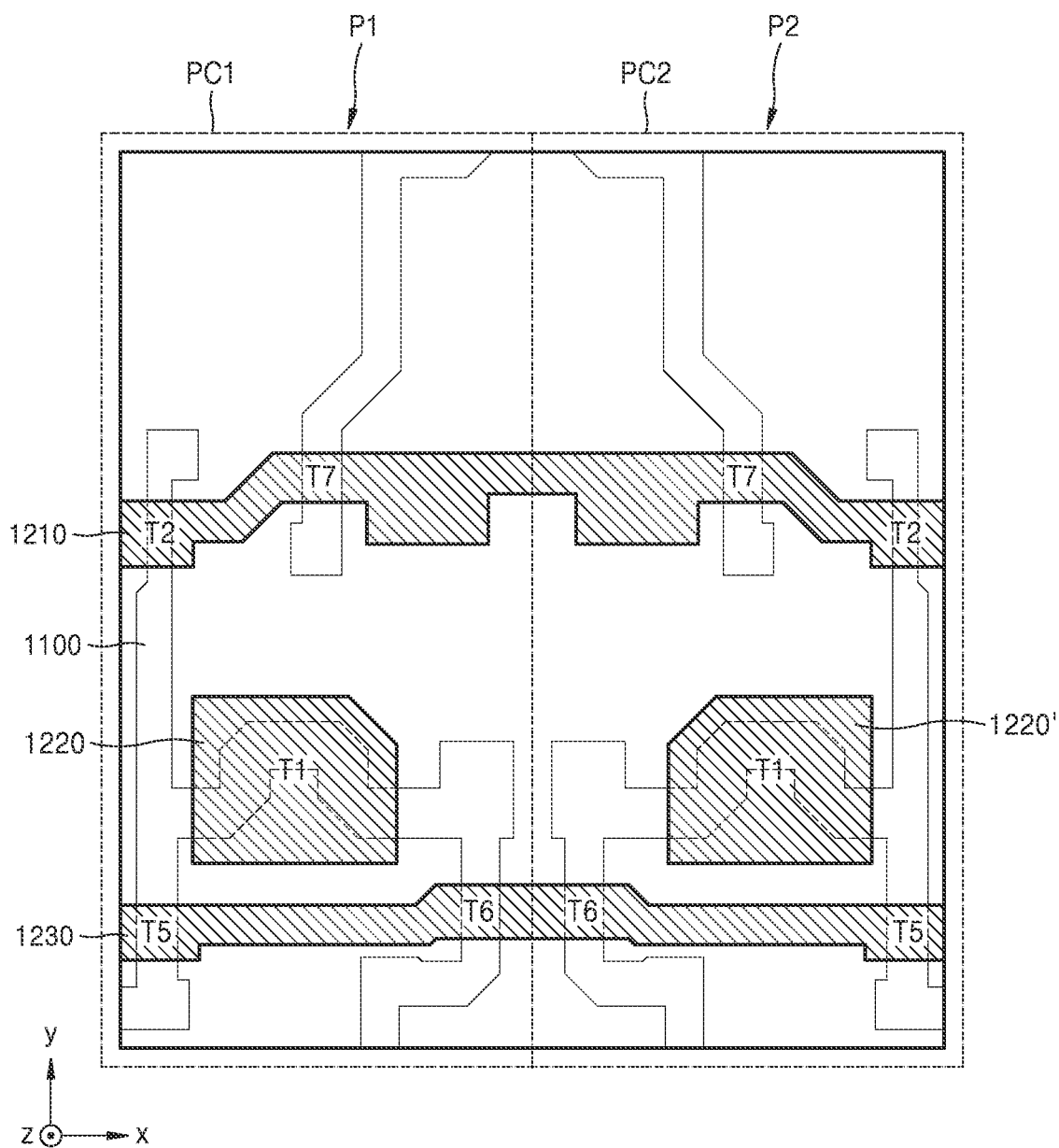

According to some embodiments, a portion of the first active pattern 1100 corresponding to the second pixel circuit PC2 may be referred to as a third active pattern 1100'. As shown in FIG. 9, a third gate electrode 1220' may be arranged on the third active pattern 1100'.

A first gate insulating layer 113 (refer to FIG. 15) may cover the first active pattern 1100 and may be arranged over the substrate 100. The first gate insulating layer 113 may include an insulating material. For example, the first gate insulating layer 113 may include silicon oxide, silicon nitride, silicon oxynitride, aluminum oxide, etc.

Referring to FIG. 9 with FIGS. 7 and 15, a first conductive pattern 1200 may be arranged on the first gate insulating layer 113. The first conductive pattern 1200 may include a first gate line 1210, a first gate electrode 1220, and a second gate line 1230.

The first gate line 1210 may extend in a first direction (e.g., a direction x). The first gate line 1210 may correspond to the first scan line SL1 of FIG. 6. The first gate line 1210 may constitute the switching thin-film transistor T2 together with the first active pattern 1100. For example, the first scan signal Sn may be provided to the first gate line 1210. In addition, the first gate line 1210 may constitute the second initialization thin-film transistor T7 together with the first active pattern 1100. For example, the next scan signal Sn+1 may be provided to the first gate line 1210. The first scan signal Sn and the next scan signal Sn+1 may have substantially the same waveform with a time difference.

The first gate electrode 1220 may be arranged in an island shape. The first gate electrode 1220 may constitute the driving thin-film transistor T1 together with the first active pattern 1100.

The second gate line 1230 may extend in the first direction (e.g., the direction x). The second gate line 1230 may correspond to the emission control line EL of FIG. 6. The second gate line 1230 may constitute the operation control and emission control thin-film transistors T5 and T6 together with the first active pattern 1100. For example, the emission control signal En may be provided to the second gate line 1230.

The first conductive pattern 1200 may include metal, an alloy, conductive metal oxide, a transparent conductive material, etc. For example, the first conductive pattern 1200 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), etc.

A second gate insulating layer 115 (that is, the second gate insulating layer 115 of FIG. 15) may cover the first conductive pattern 1200 and may be arranged on the first gate insulating layer 113. The second gate insulating layer 115 may include an insulating material as the first gate insulating layer 113 does.

Figure 10:
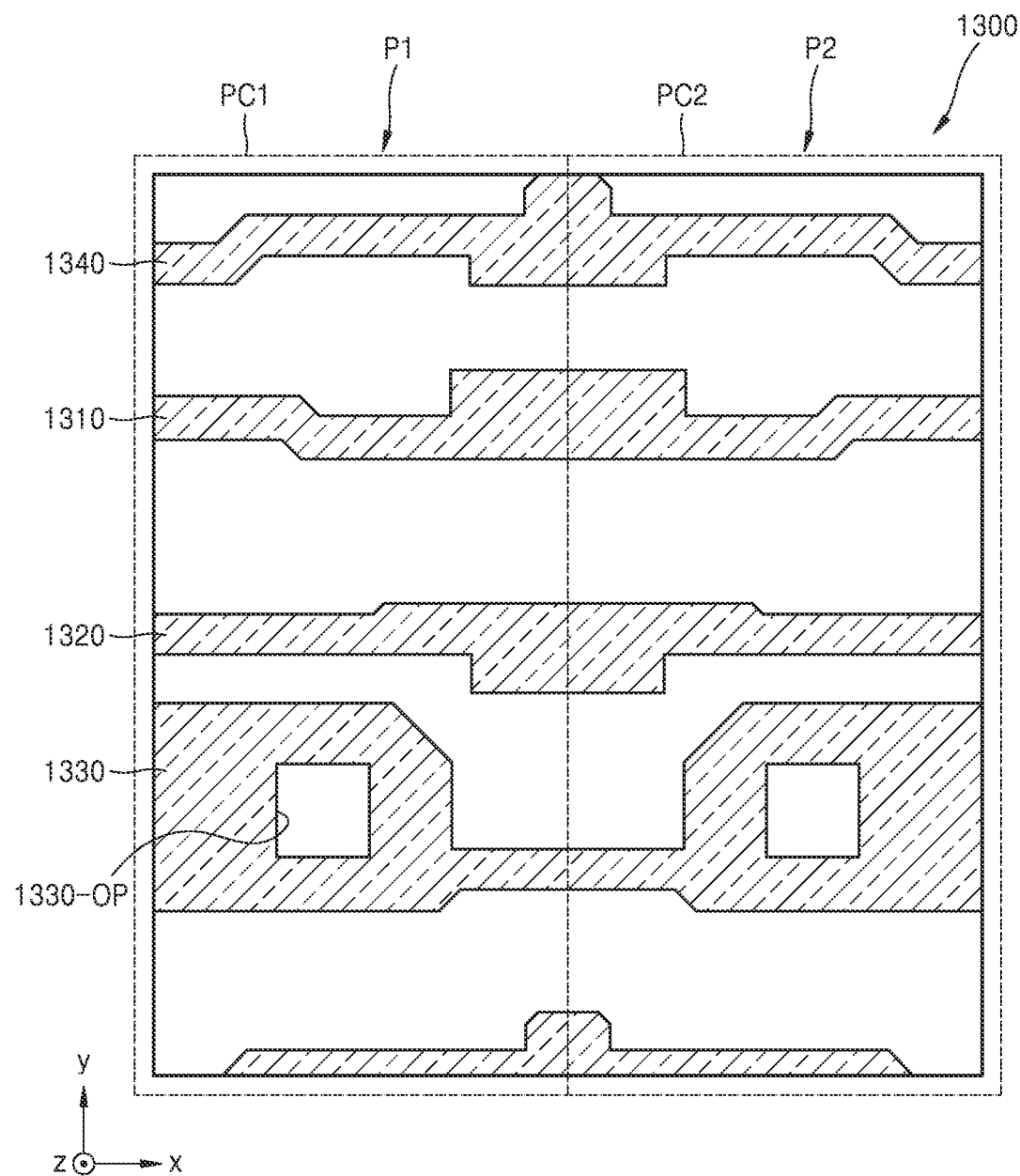

Referring to FIG. 10 with FIGS. 7 and 15, a second conductive pattern 1300 may be arranged on the second gate insulating layer 115. The second conductive pattern 1300 may include a third gate line 1310, a fourth gate line 1320, a storage capacitor electrode 1330 (that is, the second electrode CE2 of FIG. 6), and a first initialization voltage line 1340 (that is, the first initialization voltage line VL1 of FIG. 6).

The third gate line 1310 may extend in a first direction (e.g., a direction x). The third gate line 1310 may correspond to the previous scan line SLp of FIG. 6. The third gate line 1310 may be spaced apart from the first gate line 1210 in a plan view. The previous scan signal Sn−1 may be provided to the third gate line 1310.

The fourth gate line 1320 may extend in the first direction (e.g., the direction x). The fourth gate line 1320 may correspond to the second scan line SL2 of FIG. 6. The fourth gate line 1320 may be spaced apart from the first gate line 1210 and the third gate line 1310 in a plan view. The second scan signal Sn' may be provided to the fourth gate line 1320.

The storage capacitor electrode 1330 may overlap the first gate electrode 1220 and may extend in the first direction (e.g., the direction x). For example, the storage capacitor electrode 1330 may constitute the storage capacitor Cst together with the first gate electrode 1220. The driving voltage ELVDD may be provided to the storage capacitor electrode 1330. In addition, a hole through the storage capacitor electrode 1330 may be formed in the storage capacitor electrode 1330, and the first gate electrode 1220 may be exposed through the hole.

The first initialization voltage line 1340 may extend in the first direction (e.g., the direction x). The first initialization voltage line 1340 may be spaced apart from the third gate line 1310 in a plan view. The first initialization voltage Vint may be provided through the first initialization voltage line 1340. The first initialization voltage line 1340 may at least partially overlap a second active pattern 1400 described below and may be configured to transfer the first initialization voltage Vint to the second active pattern 1400. The first initialization voltage line 1340 may be electrically connected to the second active pattern 1400 through contact portions 1680CNT1, 1680CNT2, and 1680CNT3 shown in FIG. 13 described below. The first initialization voltage line 1340 may be the first initialization voltage line VL1 of FIG. 6.

The second conductive pattern 1300 may include, for example, metal, an alloy, conductive metal oxide, a transparent conductive material, etc.

A first interlayer insulating layer 117 (refer to FIG. 15) may cover the second conductive pattern 1300 and may be arranged on the second gate insulating layer 115. The first interlayer insulating layer 117 may include an insulating material. For example, the first interlayer insulating layer 117 may include silicon oxide, silicon nitride, silicon oxynitride, aluminum oxide, etc.

Figure 11:
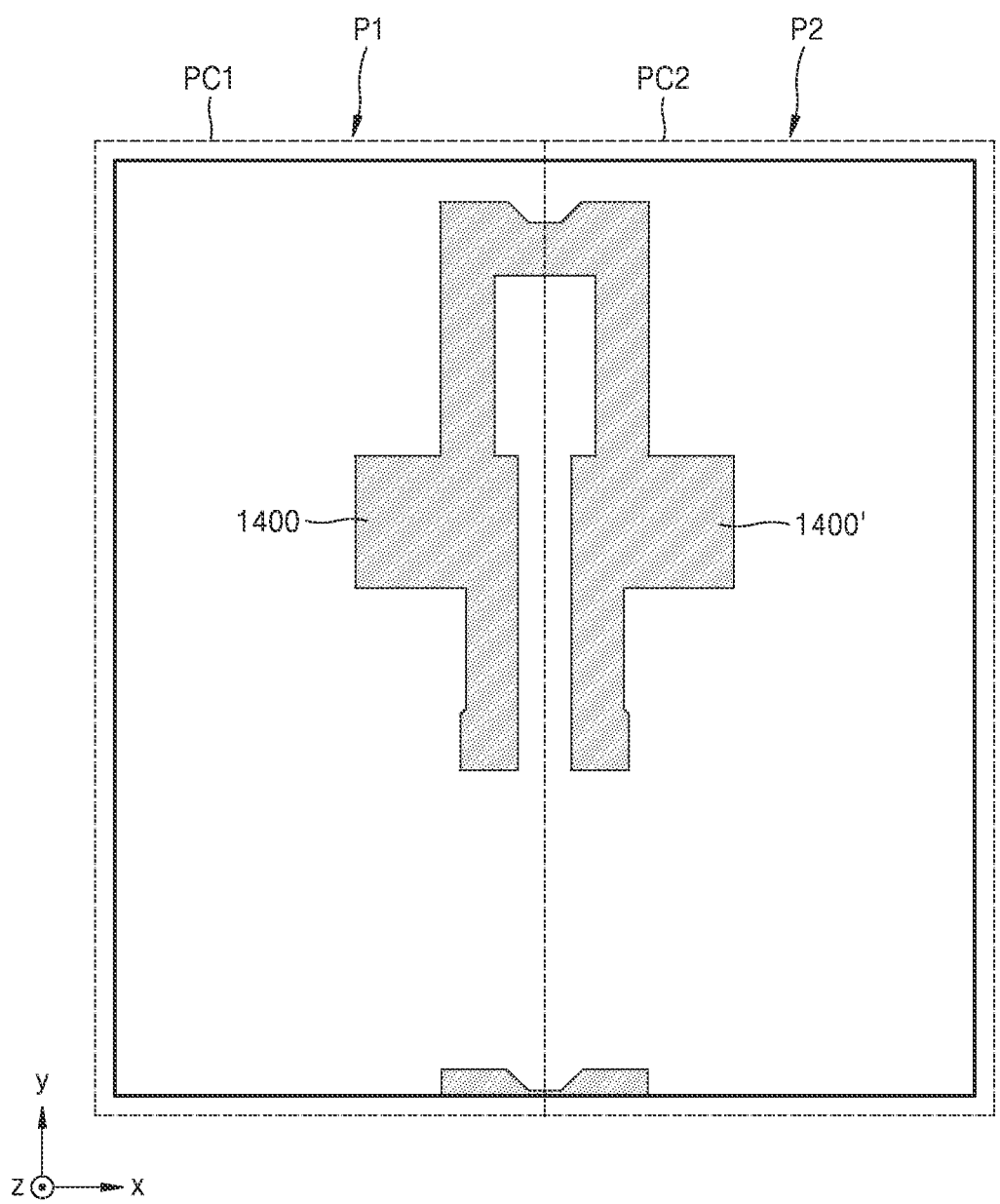

Referring to FIG. 11 with FIGS. 7 and 15, the second active pattern 1400 may be arranged on the first interlayer insulating layer 117. According to some embodiments, the second active pattern 1400 may include an oxide semiconductor. The second active pattern 1400 may be arranged on a different layer from the first active pattern 1100 and may not overlap the first active pattern 1100.

A third gate insulating layer 118 may cover the second active pattern 1400 and may be arranged over the first interlayer insulating layer 117. The third gate insulating layer 118 may include an insulating material.

According to some embodiments, as shown in FIG. 15, the third gate insulating layer 118 may be patterned to cover a portion of the second active pattern 1400 and expose the remaining portion. In this regard, the third gate insulating layer 118 may be formed in the same pattern as a second gate electrode 1520 of FIG. 12 described below. Accordingly, the second active pattern 1400 may have a source region and a drain region exposed except a channel region overlapping the second gate electrode 1520. As shown in FIG. 15, the source region and the drain region may directly contact a second interlayer insulating layer 119.

According to some embodiments, in FIG. 11, a portion corresponding to the second pixel circuit PC2 may be referred to as a fourth active pattern 1400'. In this case, when a portion corresponding to the first pixel circuit PC1 is referred to as the second active pattern 1400, and a portion corresponding to the second pixel circuit PC2 is referred to as the fourth active pattern 1400', the second active pattern 1400 and the fourth active pattern 1400' may be considered integral to each other.

Figure 12:
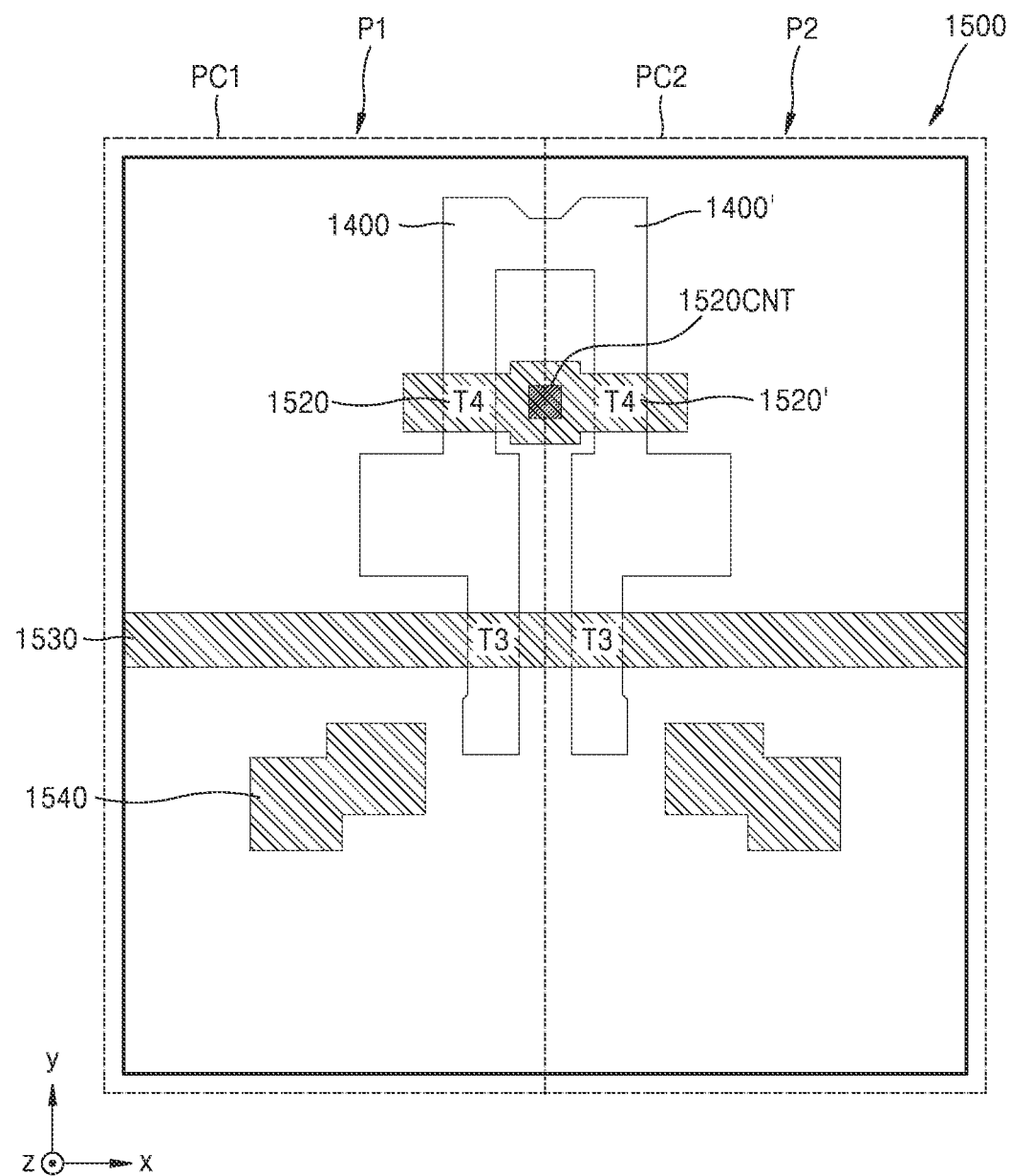

Referring to FIG. 12 with FIGS. 7 and 15, a third conductive pattern 1500 may be arranged on the third gate insulating layer 118. The third conductive pattern 1500 may include the second gate electrode 1520, a fifth gate line 1530, and a first transfer pattern 1540.

The second gate electrode 1520 (that is, a gate pattern) may overlap the third gate line 1310 and the second active pattern 1400. According to some embodiments, the second gate electrode 1520 may be electrically connected to the third gate line 1310. For example, the second gate electrode 1520 may contact the third gate line 1310 through a contact portion 1520CNT. The contact portion 1520CNT may be formed through a contact hole penetrating insulating layers (e.g., the first interlayer insulating layer 117 and the third interlayer insulating layer 118) arranged between the third gate line 1310 and the second gate electrode 1520.

The second scan signal Sn' may be provided to the second gate electrode 1520. The third gate line 1310, the second active pattern 1400, and the second gate electrode 1520 may constitute the first initialization thin-film transistor T4. For example, the third gate line 1310 may correspond to a back-gate electrode of the first initialization thin-film transistor T4, and the second gate electrode 1520 may correspond to a gate electrode of the first initialization thin-film transistor T4.

A portion of the second gate electrode 1520 corresponding to the second pixel circuit PC2 may be referred to as a fourth gate electrode 1520'. The fourth gate electrode 1520' may overlap the fourth active pattern 1400' to constitute the first initialization thin-film transistor T4 in the second pixel circuit PC2.

The fifth gate line 1530 may extend in a first direction (e.g., a direction x). The fifth gate line 1530 may overlap the fourth gate line 1320 and the second active pattern 1400. In some embodiments, the fifth gate line 1530 may be electrically connected to the fourth gate line 1320. For example, the fifth gate line 1530 may contact the fourth gate line 1320 through contact.

The second scan signal Sn' may be provided to the fifth gate line 1530. The fourth gate line 1320, the second active pattern 1400, and the fifth gate line 1530 may constitute the compensation thin-film transistor T3. For example, the fourth gate line 1320 may correspond to a back-gate electrode of the compensation thin-film transistor T3, and the fifth gate line 1530 may correspond to a gate electrode of the compensation thin-film transistor T3.

The first transfer pattern 1540 may contact the first gate electrode 1220 exposed through an opening 1330-OP of the storage capacitor electrode 1330. The first transfer pattern 1540 may be configured to transfer the initialization voltage Vint to the first gate electrode 1220.

The second interlayer insulating layer 119 may cover at least a portion of the third conductive pattern 1500 of FIG. 12. The second interlayer insulating layer 119 may include an insulating material. For example, the second interlayer insulating layer 119 may include silicon oxide, silicon nitride, silicon oxynitride, aluminum oxide, etc.

Figure 13:
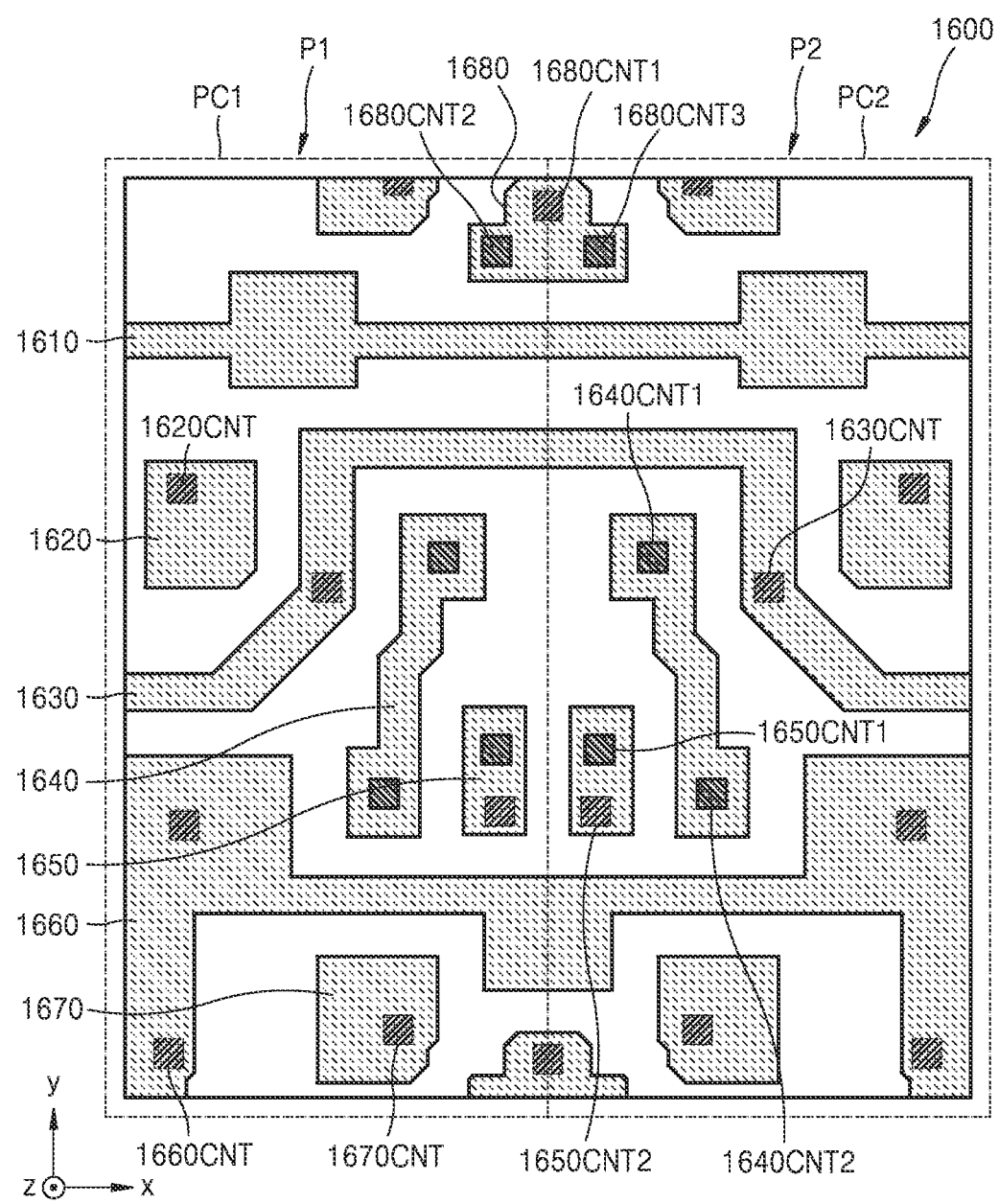

Referring to FIG. 13 with FIGS. 7 and 15, a fourth conductive pattern 1600 may be arranged on the second interlayer insulating layer 119. The fourth conductive pattern 1600 may include a first connection line 1610, a second transfer pattern 1620, a second initialization voltage line 1630, a third transfer pattern 1640, a fourth transfer pattern 1650, a fifth transfer pattern 1660, and a sixth transfer pattern 1670.

The first connection line 1610 may extend in a first direction (e.g., a direction x). The data signal Dm may be provided to the first connection line 1610.

The second transfer pattern 1620 may contact the first active pattern 1100 through a contact portion 1620CNT. The data signal Dm may be transmitted to the first active pattern 1100 through the second transfer pattern 1620.

The second initialization voltage line 1630 (that is, the second initialization voltage line VL2 of FIG. 6) may extend in the first direction (e.g., the direction x). The second initialization voltage Aint may be provided to the second initialization voltage line 1630. The second initialization voltage line 1630 may contact the first active pattern 1100 through a contact portion 1630CNT and may be configured to transfer the second initialization voltage Aint to the first active pattern 1100.

The third transfer pattern 1640 may contact the second active pattern 1400 and the first transfer pattern 1540 through contact potions 1640CNT1 and 1640CNT2 respectively formed on one side and the other side of the third transfer pattern 1640. The first initialization voltage Vint may be transferred to the first gate electrode 1220 through the second active pattern 1400, the third transfer pattern 1640, and the first transfer pattern 1540.

The fourth transfer pattern 1650 may contact the second active pattern 1400 and the first active pattern 1100 through contact portions 1650CNT1 and 1650CNT2 respectively formed on one side and the other side of the fourth transfer pattern 1650. The fourth transfer pattern 1650 may be configured to electrically connect the second active pattern 1400 and the first active pattern 1100 to each other.

The fifth transfer pattern 1660 may extend in the first direction (e.g., the direction x). The driving voltage ELVDD may be provided to the fifth transfer pattern 1660. The fifth transfer pattern 1660 may contact the first active pattern 1100 through a contact portion 1660CNT and may be configured to transfer the driving voltage ELVDD to the first active pattern 1100.

The sixth transfer pattern 1670 may contact the first active pattern 1100 through a contact portion 1670CNT. The sixth transfer pattern 1670 may be configured to transfer a driving current or the second initialization voltage Aint from the first active pattern 1100 to the organic light-emitting diode OLED.

The seventh transfer pattern 1680 may contact the second active pattern 1400 through the contact portions 1680CNT1, 1680CNT2, and 1680CNT3. The seventh transfer pattern 1680 may be configured to transfer the first initialization voltage Vint to the first initialization thin-film transistor T4 by contacting the first initialization voltage line 1340 of FIG. 10 through the contact potion 1680CNT1 and contacting the second active pattern 1400 of FIG. 11 through the contact portions 1680CNT2 and 1680CNT3.

A first planarization insulating layer 121 may cover the fourth conductive pattern 1600 and may be arranged on the second interlayer insulating layer 119. The first planarization insulating layer 121 may include an organic insulating material. For example, the first planarization insulating layer 121 may include photoresist, polyacrylic resin, polyimide-based resin, acryl-based rein, etc.

Figure 14:
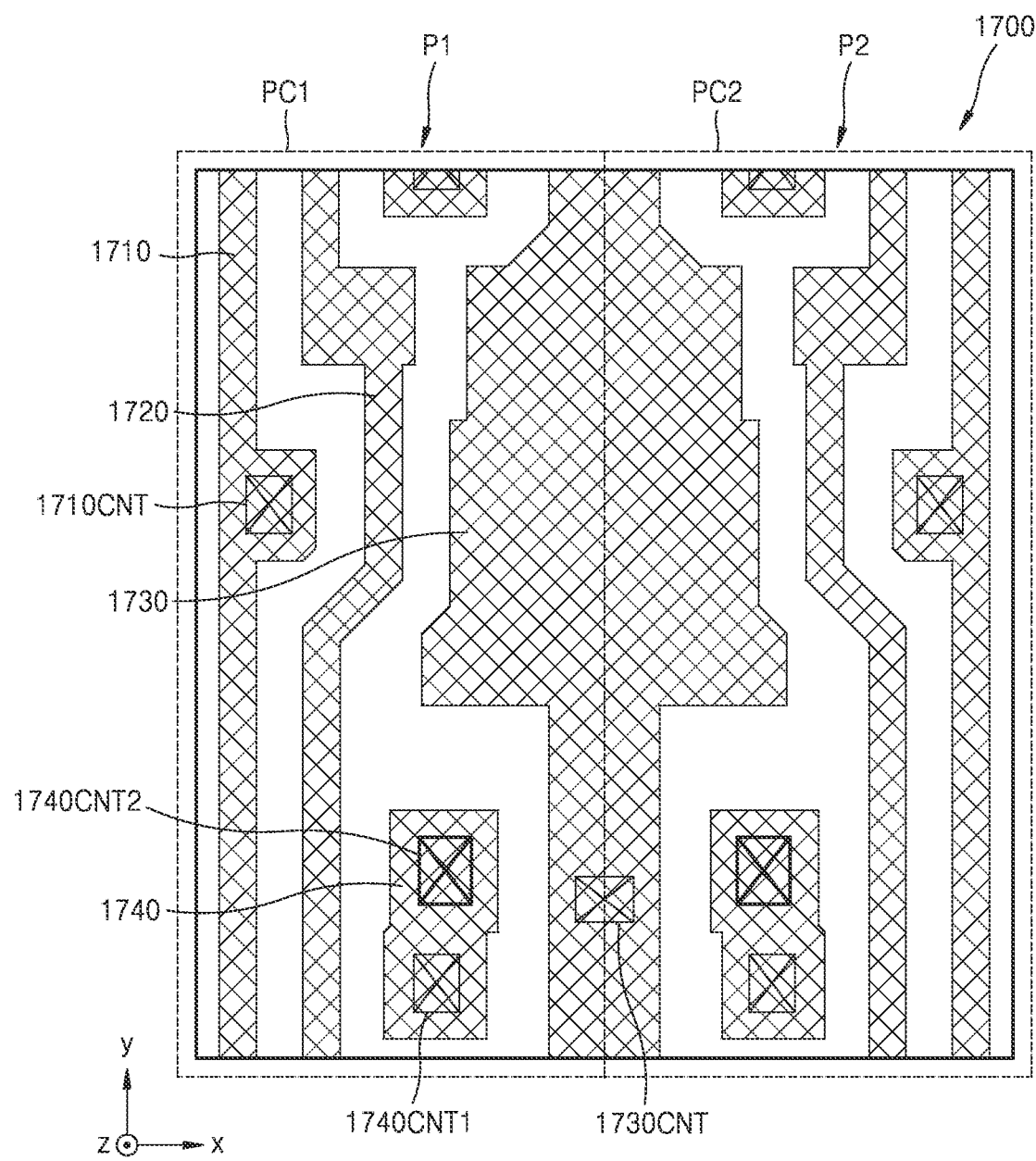
Figure 15:
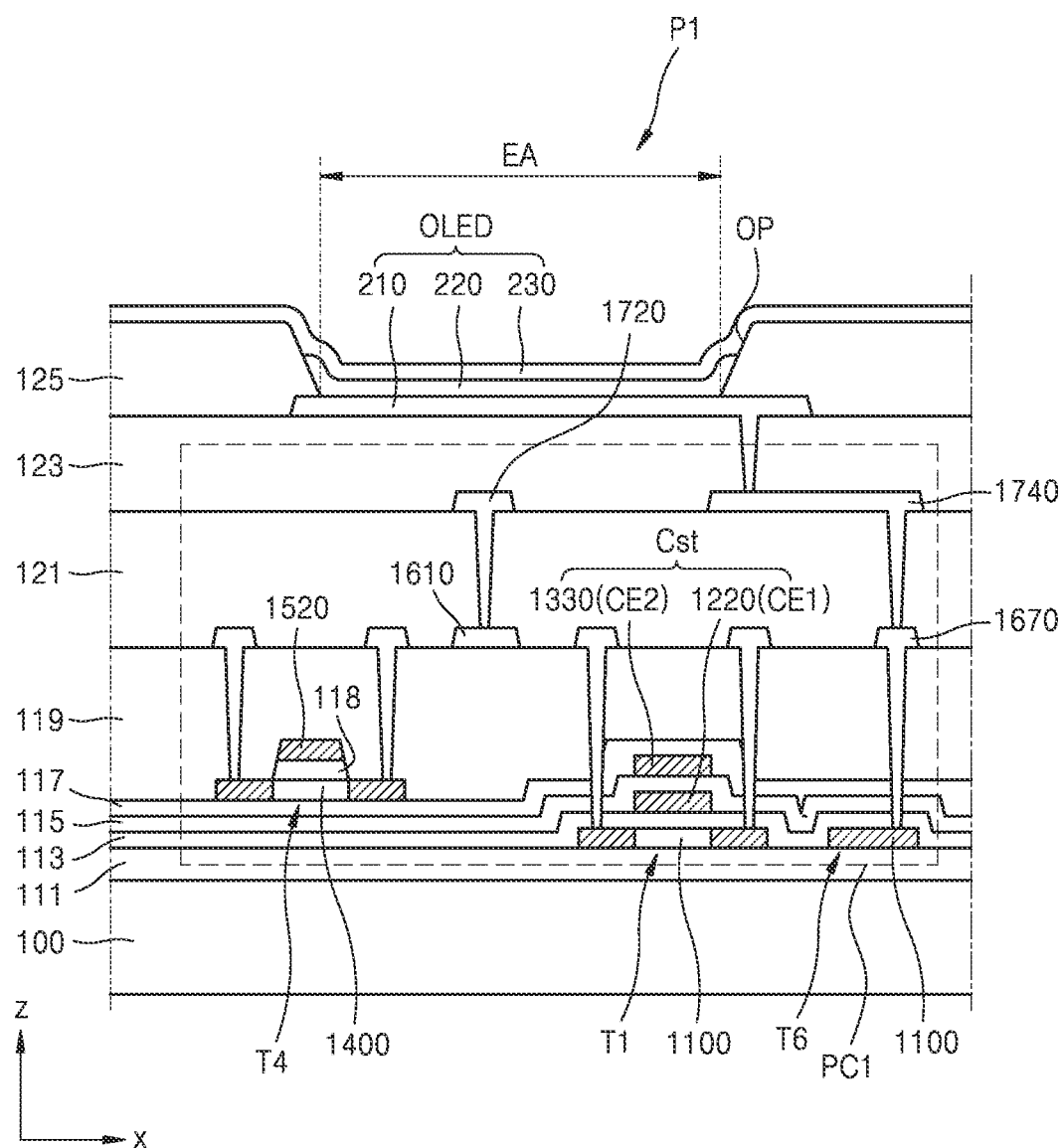
FIG. 15 is a schematic cross-sectional view of a portion of a structure of a pixel circuit according to some embodiments.

Referring to FIG. 14 with FIGS. 7 and 15, a fifth conductive pattern 1700 may be arranged on the first planarization insulating layer 121. The fifth conductive pattern 1700 may include a data line 1710, a second connection line 1720, a voltage line 1730, and an eighth transfer pattern 1740.

The data line 1710 may extend in a second direction (e.g., a direction y). The data line 1710 may correspond to the data line DL of FIG. 6. The data line 1710 may be connected to the second transfer pattern 1620 through a contact portion 1710CNT. The data signal Dm may be transmitted to the first active pattern 1100 through the data line 1710 and the second transfer pattern 1620.

The second connection line 1720 may extend in the second direction (e.g., the direction y). The second connection line 1720 may contact the first connection line 1610.

According to some embodiments, the first connection line 1610 may correspond to the first connection lines DH1 to DH3 described above with reference to FIG. 5, the data line 1710 may correspond to the first to sixth data lines DL1 to DL6 described above with reference to FIG. 5, and the second connection line 1720 may correspond to the second connection lines DV1 to DV3 or the third connection lines DV1' to DV3' described above with reference to FIG. 5.

For example, different data voltages may be provided to the data line 1710 and the second connection line 1720. For example, a first data voltage may be transferred to the first active pattern 1100 through the data line 1710, and a second data voltage different from the first data voltage may be transferred to the first connection line 1610 through the second connection line 1720.

The voltage line 1730 may extend in the second direction (e.g., the direction y). The voltage line 1730 may correspond to the driving voltage line PL of FIG. 6. The voltage line 1730 may be configured to provide the driving voltage ELVDD. The voltage line 1730 may be connected to the fifth transfer pattern 1660 through a contact portion 1730CNT and may be configured to provide the driving voltage ELVDD to the storage capacitor electrode 1330 and the operation control thin-film transistor T5.

The voltage line 1730 may be shared between the first pixel circuit PC1 and the second pixel circuit PC2 adjacent to each other. According to some embodiments, the voltage line 1730 may be provided in each of the first pixel circuit PC1 and the second pixel circuit PC2.

The eighth transfer pattern 1740 may contact the sixth transfer pattern 1670 through a contact portion 1740CNT1. The eighth transfer pattern 1740 may be configured to transfer the driving current IDLED or the anode initialization voltage Aint from the sixth transfer pattern 1670 to the organic light-emitting diode OLED.

In addition, the eighth transfer pattern 1740 may contact a pixel electrode 210 (refer to FIG. 15) through a contact portion 1740CNT2. The emission control thin-film transistor T6 may be electrically connected to the pixel electrode 210 through the eighth transfer pattern 1740.

A second planarization insulating layer 123 may cover the fifth conductive pattern 1700 and may be arranged on the first planarization insulating layer 121. The second planarization insulating layer 123 may include an organic insulating material. For example, the first planarization insulating layer 121 and the second planarization insulating layer 123 may include a general commercial polymer such as benzocyclobutene (BCB), polyimide, hexamethyldisiloxane (HMDSO), poly(methyl methacrylate) (PMMA), or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

Referring to FIG. 15, the organic light-emitting diode OLED is arranged on the second planarization insulating layer 123. The organic light-emitting diode OLED includes the pixel electrode 210, an intermediate layer 220 including an organic emission layer, and an opposite electrode 230.

The pixel electrode 210 may be a (semi)transmissive electrode or a reflective electrode. According to some embodiments, the pixel electrode 210 may include a reflective layer including Ag, Mg, Al, Pt, Pd, Au, Ni, Nd, Ir, Cr, and a compound thereof and a transparent or semitransparent electrode layer on the reflective layer. The transparent or semitransparent electrode layer may include at least one selected from the group including indium tin oxide (ITO), indium zinc oxide (IZO), zinc oxide (ZnO), indium oxide ($In_2O_3$), indium gallium oxide (IGO), and aluminum zinc oxide (AZO). For example, the pixel electrode 210 may include ITO/Ag/ITO.

A pixel-defining layer 125 may be arranged on the second planarization insulating layer 123. The pixel-defining layer 125 may prevent an arc, etc. from occurring at the edge of the pixel electrode 210 by increasing a distance between the edge of the pixel electrode 210 and the opposite electrode 230 arranged over the pixel electrode 210.

The pixel-defining layer 125 may be formed by a method such as spin coating, using one or more organic insulating materials selected from the group including polyimide, polyamide, acrylic resin, BCB, and phenol resin.

The intermediate layer 220 of the organic light-emitting diode OLED may be arranged in an opening OP formed by the pixel-defining layer 125. An emission area EA of the organic light-emitting diode OLED may be defined by the opening OP.

The intermediate layer 220 may include an organic emission layer. The organic emission layer may include an organic material including a fluorescent or phosphorescent material that emits red, green, blue, or white light. The organic emission layer may include a low-molecular weight organic material or a high-molecular weight organic material, and functional layers such as a hole transport layer (HTL), a hole injection layer (HIL), an electron transport layer (ETL), and an electron injection layer (EIL) may be selectively further arranged under and on the organic emission layer.

The organic emission layer may correspond to each pixel electrode 210 provided for each pixel P. The intermediate layer 220 may be variously modified, for example, to include an integral layer over a plurality of pixel electrodes 210 in addition to the organic emission layer.

The opposite electrode 230 may be a transmissive electrode or a reflective electrode. In some embodiments, the opposite electrode 230 may be a transparent or semitransparent electrode and may include a metal thin film having a low work function including Li, Ca, LiF/Ca, LiF/Al, Al, Ag, Mg, and a compound thereof. In addition, a transparent conductive oxide (TCO) film such as ITO, IZO, ZnO, or $In_2O_3$ may be further arranged on the metal thin film. The opposite electrode 230 may be integrally formed over the entire surface of the display area DA and thus may be arranged on the intermediate layer 220 and the pixel-defining layer 125.

Figure 16:
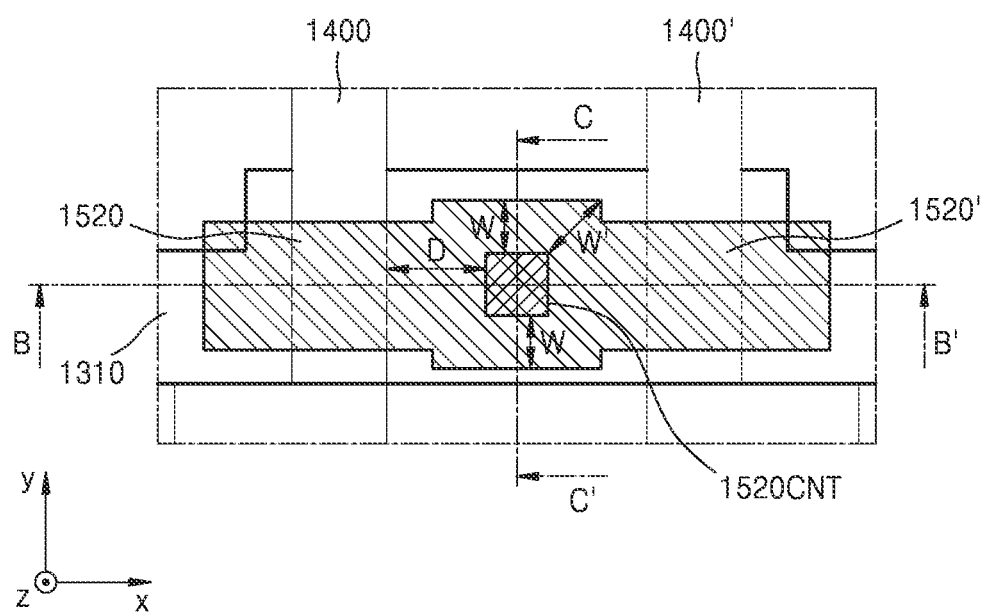
FIG. 16 is a schematic plan view of a portion of a pixel circuit according to some embodiments.
Figure 17:
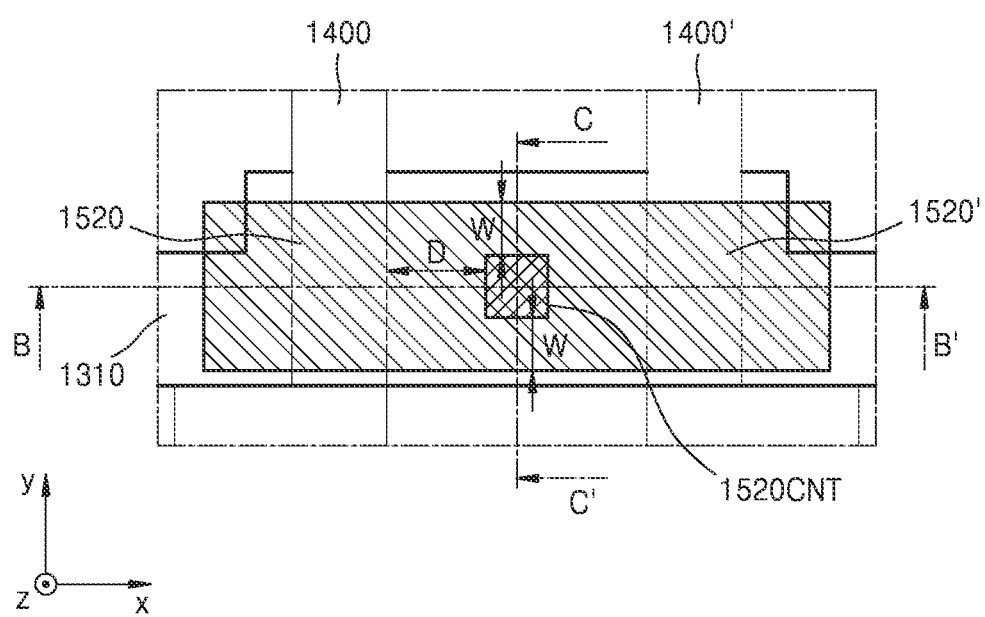
FIG. 17 shows a modified example of FIG. 16 according to some embodiments.
Figure 18:
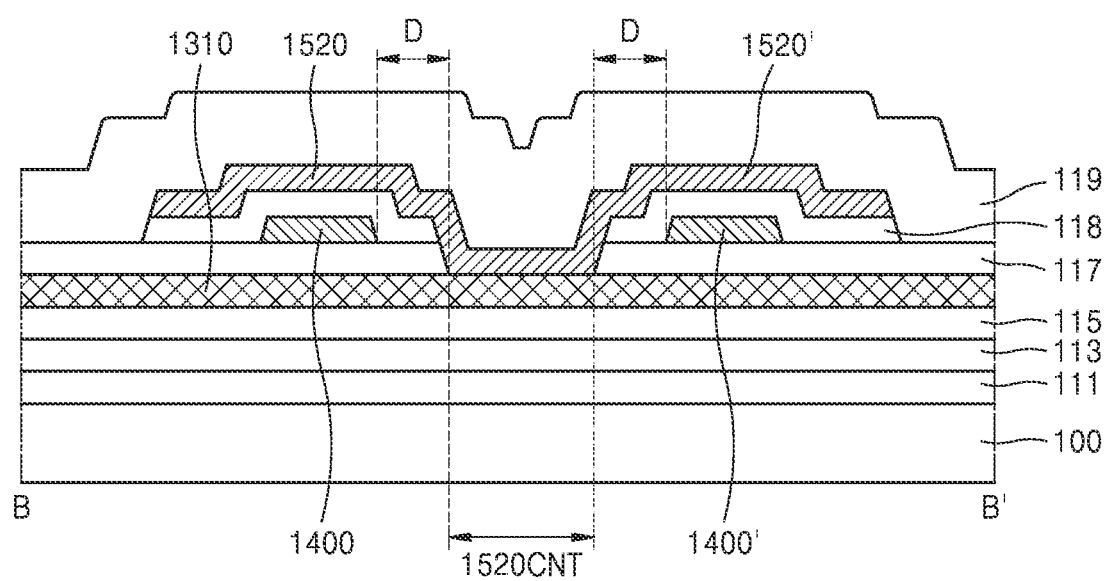
FIG. 18 is a schematic cross-sectional view of the pixel circuit of FIG. 16, taken along the line B-B' of FIG. 16 according to some embodiments.
Figure 19:
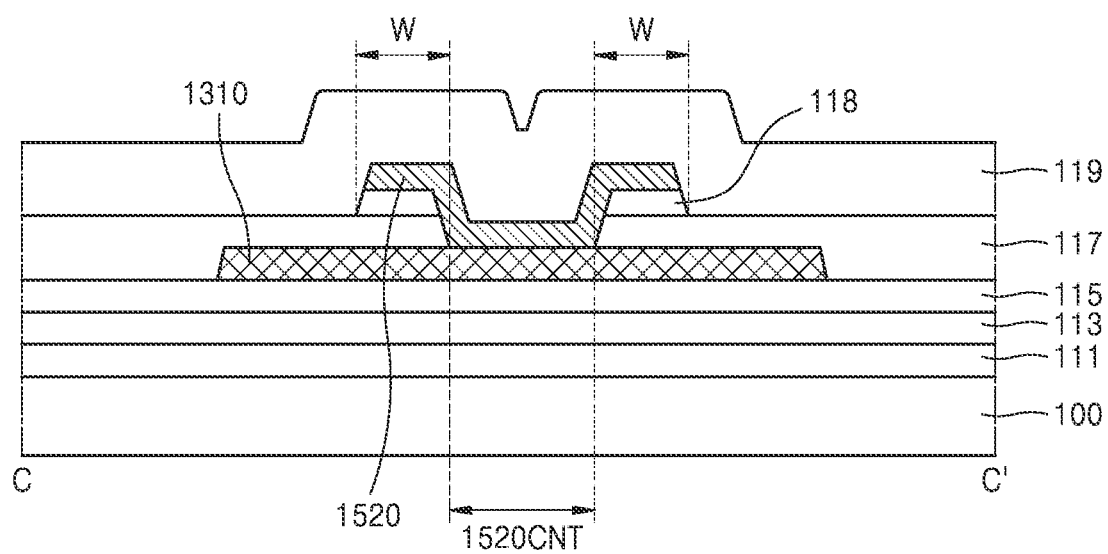
FIG. 19 is a schematic cross-sectional view of the pixel circuit of FIG. 16, taken along line C-C' of FIG. 16 according to some embodiments.
Figure 20:
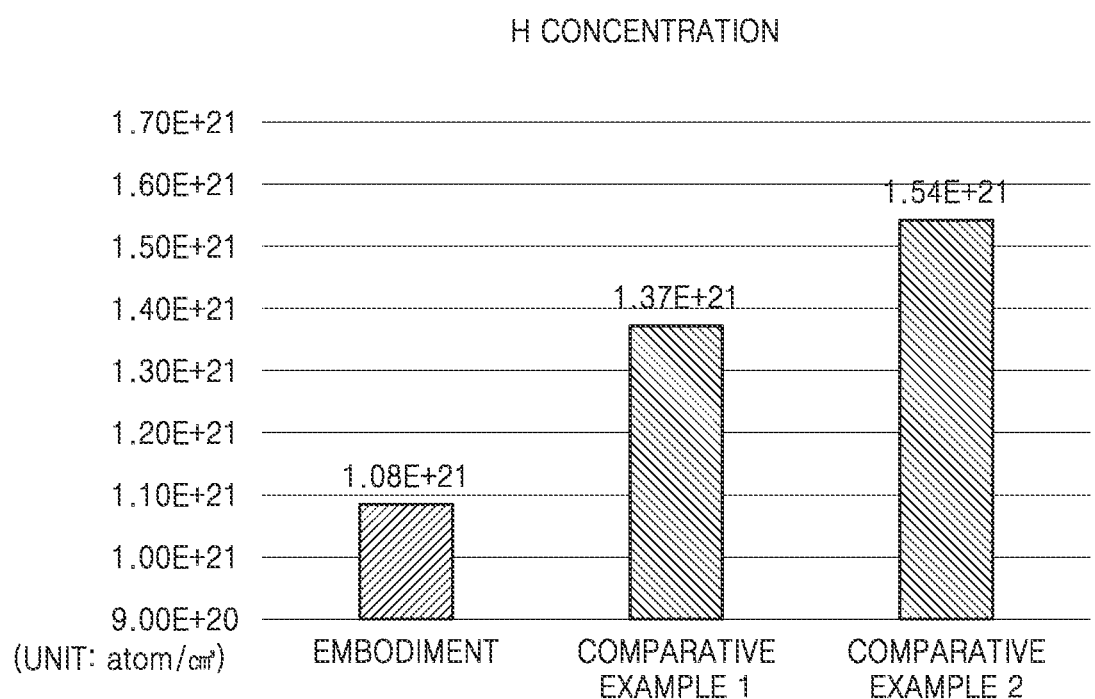
FIG. 20 is a graph of hydrogen ion concentration measurement by comparing an embodiment with comparative examples.

FIG. 16 is a schematic plan view of a portion of a pixel circuit according to some embodiments, and FIG. 17 shows a modified example of FIG. 16. FIG. 18 is a schematic cross-sectional view of the pixel circuit of FIG. 16, taken along line B-B' of FIG. 16, and FIG. 19 is a schematic cross-sectional view of the pixel circuit of FIG. 16, taken along line C-C' of FIG. 16. FIG. 20 is a graph of hydrogen ion concentration measurement by comparing an embodiment with comparative examples.

Hereinafter, the second active pattern 1400 and the fourth active pattern 1400' integrally formed with each other will be referred to as the second active pattern 1400 in the descriptions of FIGS. 16 to 19. In addition, the second gate electrode 1520 and the fourth gate electrode 1520' integrally formed with each other will be referred to as the second gate electrode 1520. A conductive pattern constituting the second gate electrode 1520 and the fourth gate electrode 1520' may be referred to as a 'gate pattern'. The gate pattern may be arranged in an island shape. That is, the gate pattern may be isolated from other patterns arranged on the same layer as the gate pattern.

Referring to FIGS. 16, 18, and 19, the second gate electrode 1520 and the third gate line 1310 arranged above and below the second active pattern 1400 are shown. A portion of the second gate electrode 1520 and the third gate line 1310 may overlap the second active pattern 1400 to constitute the first initialization thin-film transistor T4.

As described above, for gate-sync, the second gate electrode 1520 and the third gate line 1310 may be electrically connected to each other through the contact portion 1520CNT. As shown in FIGS. 18 and 19, the contact portion 1520CNT may be defined by a contact hole penetrating the first interlayer insulating layer 117 and the third gate insulating layer 118. The contact portion 1520CNT may be arranged at the center of the second gate electrode 1520 (that is, the gate pattern).

According to some embodiments, a width W of the second gate electrode 1520 surrounding the contact portion 1520CNT may be about 1.5 µm or greater. Although FIG. 16 shows the width W along a second direction (e.g., a direction y), the width W of the second gate electrode 1520 surrounding the contact portion 1520CNT is not limited to the direction and may mean having a width of 1.5 µm or greater around the contact portion 1520CNT. For example, a width W' of the second gate electrode 1520 along a diagonal direction crossing a first direction (e.g., a direction x) and the second direction (e.g., the direction y) may also be about 1.5 µm or greater. An upper limit of the width W of the second gate electrode 1520 surrounding the contact portion 1520CNT is not limited; however, considering resolution and a distance from other conductive patterns arranged on the same layer as the second gate electrode 1520, the width W may be 10 µm or less, 5 µm, or 2.5 µm or less. As an example, in a resolution of 520 ppi, the width W of the second gate electrode 1520 surrounding the contact portion 1520CNT may be about 2 µm to about 2.5 µm.

As a comparative example, when the width W of the second gate electrode 1520 surrounding the contact portion 1520CNT is less than about 1.5 µm, a seam is formed at the edge of the second gate electrode 1520, and hydrogen (H), oxygen (O), and moisture ($H_2O$) are diffused through the seam portion, which may cause a defect in which a hydrogen concentration in the first initialization thin-film transistor T4 is excessively improved. As an experimental example, referring to the graph of FIG. 20, it may be seen that while a hydrogen ion concentration in a normal area according to some embodiments is 1.08E+21 (unit: atom/cm$^3$), a hydrogen ion concentration in a defective portion of comparative example 1 is 1.37E+21, and a hydrogen ion concentration in a defective portion of comparative example 2 is 1.54E+21, which is increased by as much as about 40% or greater.

Accordingly, in a display device according to some embodiments, the width W of the second gate electrode 1520 surrounding the contact portion 1520CNT is about 1.5 µm or greater to prevent the above-described defect in the contact portion 1520CNT. Thus, contact between the second gate electrode 1520 and the third gate line 1310 may be more stably implemented.

In addition, a distance D between the contact portion 1520CNT and the overlapping portion of the second active pattern 1400 in a plan view may be about 1.3 µm or greater. An upper limit of the distance D is not particularly limited; however, considering resolution and arrangement with other conductive patterns, the distance D may be 10 µm or less, 5 µm, or 2.5 µm or less.

In this regard, during a process of forming a contact hole penetrating the first interlayer insulating layer 117 and the third gate insulating layer 118, when a distance between the contact hole and the second active pattern 1400 is too close, consumption of the second active pattern 1400 occurs, and accordingly, performance of the first initialization thin-film transistor T4 may deteriorate, or a defect may occur. Accordingly, according to some embodiments, as the distance D between the contact portion 1520CNT and the overlapping portion of the second active pattern 1400 in a plan view is 1.3 µm or greater, consumption of the second active pattern 1400 may be effectively prevented during formation of a contact hole.

Referring to FIG. 16, the second gate electrode 1520 may substantially have a '+' shape. That is, in the second gate electrode 1520, a width around the contact portion 1520CNT, which is a central area, is greater than that of other areas.

According to some embodiments, as shown in FIG. 17, the second gate electrode 1520 may substantially have a rectangular shape, and thus, all areas along a second direction (e.g., a direction y) may have the same width. Even in this case, the width W of the second gate electrode 1520 surrounding the contact portion 1520CNT may be about 1.5 µm or greater.

While only a display device has been mainly described, embodiments according to the present disclosure are not limited thereto. For example, a display device manufacturing method for forming such a display device will also fall within the scope of the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display device comprising:
a first active pattern above a substrate;
a first gate electrode above the first active pattern;
a first gate line and a second gate line on one side and the other side of the first gate electrode in a plan view, respectively, and extending in a first direction,
a second active pattern above the first gate electrode;
a second gate electrode above the second active pattern; and
a third gate line between the first gate electrode and the first active pattern and extending in a first direction, and the third gate line is disposed on one side of the first gate line in a plan view,
wherein the second gate electrode is electrically connected to the third gate line through a contact portion penetrating an insulating layer between the second gate electrode and the third gate line,
wherein, in a plan view, a width of the second gate electrode surrounding the contact portion is 1.5 micrometers (µm) or greater.

2. The display device of claim 1, wherein the second gate electrode extends in the first direction, and the second active pattern extends in a second direction crossing the first direction,
wherein the second active pattern and the second gate electrode at least partially overlap each other,
wherein, in a plan view, a distance between the contact portion and the second active pattern is 1.3 µm or greater.

3. The display device of claim 1, wherein a width of the contact portion along a second direction crossing the first direction is greater than the width of the second gate electrode surrounding the contact portion.

4. The display device of claim 1, wherein the insulating layer comprises at least two insulating layers.

5. The display device of claim 1, wherein the substrate comprises a display area and a peripheral area outside the display area,
wherein the display device further comprises a first pixel comprising a first pixel circuit and a second pixel comprising a second pixel circuit, wherein the first pixel and the second pixel are adjacent to each other in the display area,
wherein the first pixel circuit comprises the first active pattern, the first gate electrode, the second active pattern, and the second gate electrode,
wherein the first pixel circuit and the second pixel circuit are symmetrical with respect to the contact portion.

6. The display device of claim 5, wherein the second pixel circuit comprises:
a third active pattern above the substrate;
a third gate electrode above the third active pattern;
a fourth active pattern above the third gate electrode; and
a fourth gate electrode above the fourth active pattern,
wherein the second gate electrode and the fourth gate electrode comprise an integral gate pattern.

7. The display device of claim 6, wherein the integral gate pattern is isolated from other patterns on a same layer as the integral gate pattern.

8. The display device of claim 6, wherein the contact portion is at a center of the integral gate pattern.

9. The display device of claim 6, further comprising a power line extending in a second direction crossing the first direction,
wherein the power line is shared between the first pixel circuit and the second pixel circuit.

10. The display device of claim 6, wherein the first active pattern and the third active pattern are on a same layer as each other and comprise a silicon semiconductor material.

11. The display device of claim 6, wherein the second active pattern and the fourth active pattern are integral to each other.

12. The display device of claim 11, wherein the second active pattern and the fourth active pattern comprise an oxide semiconductor material.

13. The display device of claim 5, further comprising a data transfer line which bypasses a portion of the display area and to which a data signal is applied.

14. The display device of claim 13, wherein the data transfer line comprises:
a first connection line above the second gate electrode and extending in the first direction; and
a second connection line above the first connection line and extending in a second direction crossing the first direction,
wherein the first connection line and the second connection line are electrically connected to each other through a connection contact portion.

15. The display device of claim 14, wherein a same data signal is applied to the first connection line and the second connection line.

16. The display device of claim 14, further comprising:
a first input line, a second input line, and a third input line sequentially arranged in the peripheral area in a direction from an edge of the peripheral area to a center of the peripheral area;
a first data line connected to the first input line;
a third data line on one side of the first data line and connected to the third input line; and
a second data line on the other side of the first data line and electrically connected to the second input line through the first connection line and the second connection line.

17. The display device of claim 16, wherein the first connection line is not electrically connected to the first data line and at least partially overlaps the first data line.

18. The display device of claim 16, wherein the first to third data lines and the second connection line are on a same layer as each other.

19. The display device of claim 1, further comprising a fifth gate line extending in the first direction and at least partially overlapping the second active pattern.

20. The display device of claim 19, wherein the fifth gate line is on a same layer as the second gate electrode.

* * * * *